US010553823B2

(12) United States Patent
Kang et al.

(10) Patent No.: US 10,553,823 B2
(45) Date of Patent: Feb. 4, 2020

(54) DISPLAY APPARATUS AND METHOD OF MANUFACTURING THE DISPLAY APPARATUS

(71) Applicant: Samsung Display Co., Ltd., Yongin-si (KR)

(72) Inventors: Kinyeong Kang, Yongin-si (KR); Seungwook Chang, Yongin-si (KR); Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/136,206

(22) Filed: Sep. 19, 2018

(65) Prior Publication Data

US 2019/0019988 A1    Jan. 17, 2019

Related U.S. Application Data

(63) Continuation of application No. 15/093,091, filed on Apr. 7, 2016, now Pat. No. 10,128,461.

(30) Foreign Application Priority Data

Aug. 11, 2015  (KR) ........................ 10-2015-0113368

(51) Int. Cl.
*H01L 51/52*  (2006.01)
*H01L 27/32*  (2006.01)
(Continued)

(52) U.S. Cl.
CPC .......... *H01L 51/5253* (2013.01); *G04B 19/04* (2013.01); *G04C 17/0091* (2013.01);
(Continued)

(58) Field of Classification Search
CPC ............ H01L 51/5253; H01L 27/3258; H01L 51/0096; H01L 51/56; H01L 27/3237; H01L 27/3246; G04B 19/04
(Continued)

(56) References Cited

U.S. PATENT DOCUMENTS 4,488,818 A * 12/1984 Saurer ................. G04G 9/0094
368/242
5,936,914 A * 8/1999 Yamaguchi ............ G04B 19/30
368/205

(Continued)

FOREIGN PATENT DOCUMENTS

CN          1592510      3/2005
CN          102983279    3/2013
(Continued)

OTHER PUBLICATIONS

Notice of Allowance dated May 21, 2018, in U.S. Appl. No. 15/093,091.
(Continued)

*Primary Examiner* — Karen Kusumakar
*Assistant Examiner* — Adam S Bowen
(74) *Attorney, Agent, or Firm* — H.C. Park & Associates, PLC

(57) ABSTRACT

A display apparatus includes a first display area including a first display unit configured to generate light and a first encapsulation unit disposed on the first display unit; a second display area including a second display unit configured to generate light and a second encapsulation unit disposed on the second display unit; and a through area disposed between the first display area and the second display area. The first encapsulation unit includes a first encapsulation layer covering a first side of an area of the first display unit corresponding to the through area. The second
(Continued)

encapsulation unit includes a second encapsulation layer covering a second side of an area of the second display unit corresponding to the through area.

44 Claims, 30 Drawing Sheets

(51) Int. Cl.
    *G04B 19/04*         (2006.01)
    *H01L 51/00*         (2006.01)
    *H01L 51/56*         (2006.01)
    *G04C 17/00*         (2006.01)

(52) U.S. Cl.
    CPC ...... *H01L 27/3237* (2013.01); *H01L 27/3258* (2013.01); *H01L 51/0096* (2013.01); *H01L 51/56* (2013.01); *H01L 27/3246* (2013.01)

(58) Field of Classification Search
    USPC .......................................................... 257/40
    See application file for complete search history.

(56) References Cited

U.S. PATENT DOCUMENTS

| | | | |
|---|---|---|---|
| 2005/0046347 A1 | 3/2005 | Kato et al. | |
| 2005/0242719 A1* | 11/2005 | Park | H01L 27/3223 313/504 |
| 2007/0274161 A1* | 11/2007 | Rydgren | G04C 17/0091 368/80 |
| 2008/0297042 A1* | 12/2008 | Ahn | H01L 27/3251 313/504 |
| 2014/0049449 A1* | 2/2014 | Park | G09G 5/00 345/1.3 |
| 2014/0118221 A1 | 5/2014 | Park et al. | |
| 2014/0133282 A1* | 5/2014 | Hamm | G04G 17/045 368/241 |
| 2014/0190565 A1* | 7/2014 | Jung | H01L 51/107 136/259 |
| 2015/0014650 A1 | 1/2015 | Lim et al. | |
| 2016/0072099 A1 | 3/2016 | Okamoto et al. | |

FOREIGN PATENT DOCUMENTS

| | | |
|---|---|---|
| CN | 103811672 | 5/2014 |
| JP | H10-274948 | 10/1998 |
| JP | 2006-059582 | 3/2006 |
| JP | 2010-014475 | 1/2010 |
| JP | 2014-096355 | 5/2014 |
| KR | 10-2008-0086268 | 9/2008 |
| KR | 10-2014-0052713 | 5/2014 |
| WO | 2014174892 | 10/2014 |
| WO | 2016/078915 | 5/2016 |

OTHER PUBLICATIONS

Non-Final Office Action dated Oct. 19, 2017, in U.S. Appl. No. 15/093,091.
Extended European Search Report dated Dec. 14, 2016, in European Patent Application No. 16180944.7.
Chinese Office Action dated Mar. 18, 2019, in Chinese Patent Application No. 201610625720.6.
European Office Action dated Jul. 9, 2019, issued in European Patent Application No. 16180944.7.
Chinese Office Action dated Nov. 20, 2019, in Chinese Patent Application No. 201610625720.6.

* cited by examiner

DISPLAY APPARATUS AND METHOD OF MANUFACTURING THE DISPLAY APPARATUS

CROSS-REFERENCE TO RELATED APPLICATION

This application is a continuation of U.S. patent application Ser. No. 15/093,091, filed Apr. 7, 2016, and claims priority from and the benefit of Korean Patent Application No. 10-2015-0113368, filed Aug. 11, 2015, each of which is hereby incorporated by reference for all purposes as if fully set forth herein.

BACKGROUND

Field

One or more exemplary embodiments relate to display technology, and, more particularly, to display devices and methods of manufacturing the display devices.

Discussion of the Background

Use of conventional display devices, such as flat panel display devices, has become diversified with an increasing range of uses due, in part, to the relatively small thickness and relatively lightweight of the display devices. Given that display devices may be formed in a flat shape, various methods may be used to design a shape of the display devices, and functions that may be applied or linked to the display devices increase.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments include display apparatuses having an improved user convenience and an improved durability and methods of manufacturing the display apparatuses.

Additional aspects will be set forth in part in the description which follows and, in part, will be apparent from the disclosure, or may be learned by practice of the inventive concept.

According to one or more exemplary embodiments, a display apparatus includes a first display area including a first display unit configured to generate light and a first encapsulation unit disposed on the first display unit; a second display area including a second display unit configured to generate light and a second encapsulation unit disposed on the second display unit; and a through area disposed between the first display area and the second display area. The first encapsulation unit includes a first encapsulation layer covering a first side of an area of the first display unit corresponding to the through area. The second encapsulation unit includes a second encapsulation layer covering a second side of an area of the second display unit corresponding to the through area.

According to one or more exemplary embodiments, a method of manufacturing a display apparatus includes forming a first display area including a first display unit configured to generate light and a first encapsulation unit disposed on the first display unit; forming a second display area including a second display unit configured to generate light and a second encapsulation unit disposed on the second display unit; and forming a through area between the first display area and the second display area. The first encapsulation unit includes a first encapsulation layer covering a first side of an area of the first display unit corresponding to the through area. The second encapsulation unit includes a second encapsulation layer covering a second side of an area of the second display unit corresponding to the through area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
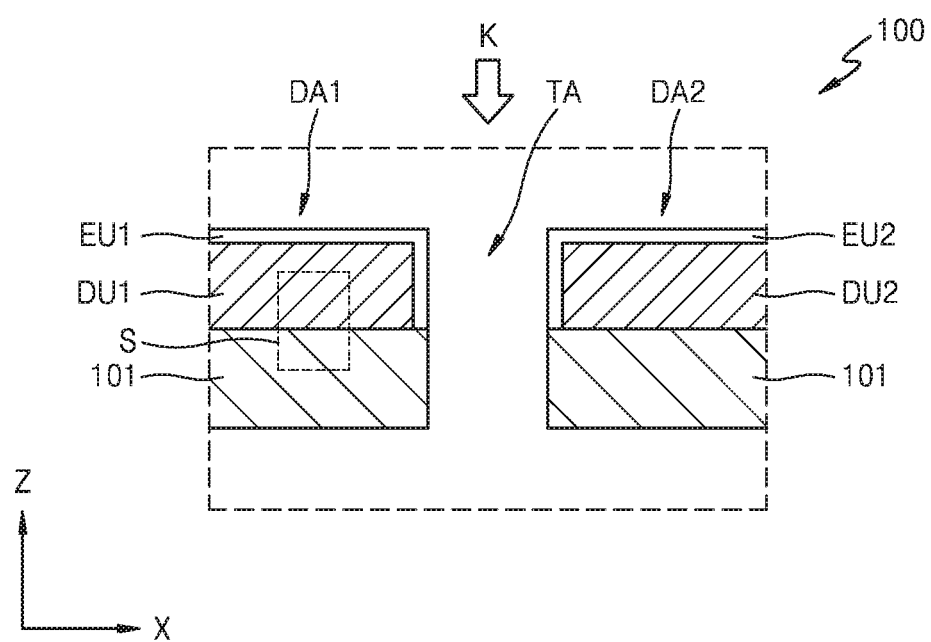
FIG. 1 is a schematic cross-sectional view of a display apparatus, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 3:
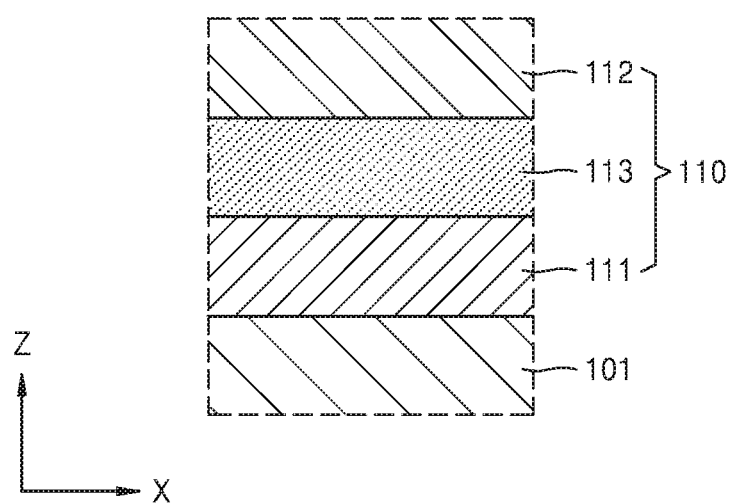
FIG. 3 is an enlarged schematic cross-sectional view of region S of the display apparatus of FIG. 1, according to one or more exemplary embodiments.

FIG. 1 is a schematic cross-sectional view of a display apparatus, according to one or more exemplary embodiments. FIG. 3 is an enlarged cross-sectional view of region S of the display apparatus of FIG. 1.

Referring to FIGS. 1 and 3, the display apparatus 100 may include a first display area DA1, a second display area DA2, and a through area TA. The through area TA may be disposed between the first display area DA1 and the second display area DA2. In some exemplary embodiments, the display apparatus 100 may include a substrate 101 on which the first display area DA1 and the second display area DA2 may be disposed. The substrate 101 may enable relatively easy formation of the first display area DA1 and the second display area DA2, as well as improve the durability of the display apparatus 100. The substrate 101 may include any suitable materials, such as, for example, a glass material, a metal material, or other organic materials. In some exemplary embodiments, the substrate 101 may include a flexible material. For example, the substrate 101 may be intentionally bent, curved, folded, rolled, and/or the like. It is also contemplated that the substrate 101 may include ultra-thin glass, metal, or plastic. For instance, when the substrate 101 is formed using plastic, polyimide (PI) may be utilized, however, any other suitable material may be utilized in association with exemplary embodiments described herein.

The through area TA may have a shape corresponding to the whole thickness of the substrate 101. That is, the through area TA may extend through the thickness of the substrate 101. Although not shown, in some exemplary embodiments, the through area TA may be formed to correspond to a part of the thickness of the substrate 101. In this manner, the thickness of an area of the substrate 101 corresponding to the through area TA may be smaller than the thickness of another area of the substrate 101. The first display area DA1 and the second display area DA2 will be described in more detail below.

The first display area DA1 may include a first display unit DU1 and a first encapsulation unit EU1. The first display area DA1 may be formed on the substrate 101 and may be configured to generate light. A user may recognize the light generated by the first display unit DU1. To this end, the first display unit DU1 may include one or more display devices. For example, as shown in FIG. 3, the first display unit DU1 may include an organic light-emitting device 110. The organic light-emitting device 110 may include a first electrode 111, a second electrode 112, and an intermediate layer 113.

The first electrode 111 may include any suitable conductive material. In some exemplary embodiments, the first electrode 111 may be patterned, and, when the first display area DA1 includes a plurality of pixels (not shown), the first electrode 111 may be patterned to correspond to the pixels, respectively. In some exemplary embodiments, the first electrode 111 may include at least one material selected from the group consisting of transparent conductive oxides including indium tin oxide (ITO), indium zinc oxide (IZO), zinc oxide (ZnO), indium oxide ($In_2O_3$), indium gallium oxide (IGO), aluminum zinc oxide (AZO), and gallium zinc oxide (GZO). It is also contemplated that one or more conductive polymers (ICP) may be utilized, such as, for example, polyaniline (PANI), poly(3,4-ethylenedioxythiophene) poly(styrenesulfonate) (PEDOT:PSS), etc. The first electrode 111 may include a metal with a relatively high reflectance, such as silver (Ag), however, any other suitable metal may be utilized in association with exemplary embodiments described herein.

The intermediate layer 113 may include an organic emission layer including a relatively small molecular organic material or a polymer molecular organic material. In some exemplary embodiments, the intermediate layer 113 may include the organic emission layer and may further include at least one layer selected from the group consisting of a hole injection layer (HIL), a hole transport layer (HTL), an electron transport layer (ETL), and an electron injection layer (EIL). The second electrode 112 may include any suitable conductive material, such as, for example, lithium (Li), calcium (Ca), lithium fluoride (LiF), aluminum (Al), magnesium (Mg), silver (Ag), etc. The second electrode 112 may include a single layer or multiple layers including at least one of the conductive materials, and may include an alloy including at least two of the conductive materials.

The first encapsulation unit EU1 may be formed on the first display unit DU1 and may have a extending shape to correspond to the through area TA. That is, the first encapsulation unit EU1 may be formed to at least partially cover a side of the area of the first display unit DU1 neighboring the through area TA. In some exemplary embodiments, the first encapsulation unit EU1 may be formed to completely cover the side of the area of the first display unit DU1 neighboring the through area TA. In some exemplary embodiments, the first encapsulation unit EU1 may include any suitable insulating material. For example, the first encapsulation unit EU1 may include an inorganic material. In some exemplary embodiments, the first encapsulation unit EU1 may include an oxide or nitride material. For instance, the first encapsulation unit EU1 may include silicon nitride ($SiN_x$), silicon oxide ($SiO_x$), or silicon oxynitride ($SiO_xN_y$).

According to one or more exemplary embodiments, the first encapsulation unit EU1 may include an organic material. In some exemplary embodiments, the first encapsulation unit EU1 may include a metal material. Further, the first encapsulation unit EU1 may extend to a top surface of the substrate 101. In some exemplary embodiments, the first encapsulation unit EU1 may be spaced apart from a side of the area of the substrate 101 corresponding to the through area TA.

The second display area DA2 may include a second display unit DU2 and a second encapsulation unit EU2. The second display unit DU2 may be formed on the substrate 101 and may be configured to generate light. A user may recognize the light generated by the second display unit DU2. To this end, the second display unit DU2 may include one or more display devices. For example, like the first display unit DU1 described with reference to FIG. 3, the second display unit DU2 may also include an organic light-emitting device. The organic light-emitting device may be the same as the organic light-emitting device 110 of the first display unit DU1 described above, and, as such, a detailed description thereof is omitted.

The second encapsulation unit EU2 may be formed on the second display unit DU2 and may have an extending shape to correspond to the through area TA. That is, the second encapsulation unit EU2 may at least partially cover a side of the area of the second display unit DU2 neighboring the through area TA. In some exemplary embodiments, the second encapsulation unit EU2 may completely cover the side of the area of the second display unit DU2 neighboring the through area TA. In some exemplary embodiments, the second encapsulation unit EU2 may include any suitable insulating material. For instance, the second encapsulation unit EU2 may include an inorganic material. In some exemplary embodiments, the second encapsulation unit EU2 may include an oxide or nitride material. For example, the second encapsulation unit EU2 may include silicon nitride ($SiN_x$), silicon oxide ($SiO_x$), or silicon oxynitride ($SiO_xN_y$).

According to one or more exemplary embodiments, the second encapsulation unit EU2 may include an organic material. In some exemplary embodiments, the second encapsulation unit EU2 may include a metal material. In some exemplary embodiments, the second encapsulation unit EU2 may extend to the top surface of the substrate 101. In some exemplary embodiments, the second encapsulation unit EU2 may be spaced apart from a side of the area of the substrate 101 corresponding to the through area TA.

Figure 2A:
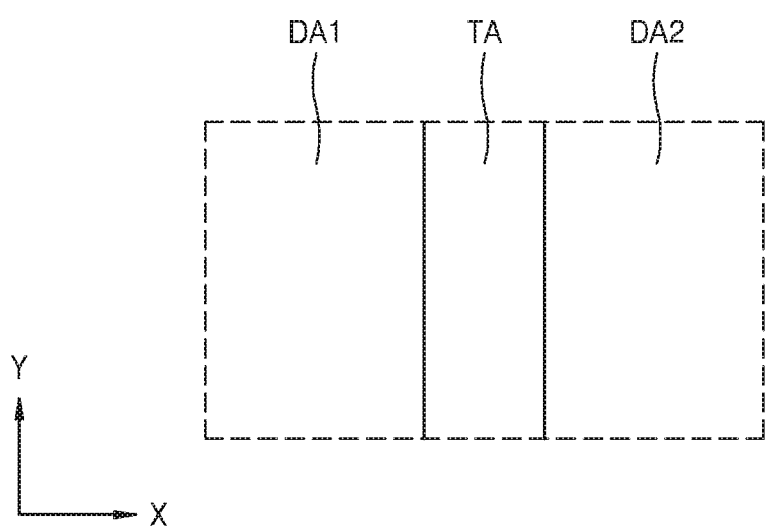
FIG. 2A is a partial plan view of the display apparatus of FIG. 1 as viewed in a direction K, according to one or more exemplary embodiments.

FIG. 2A is a partial plan view of the display apparatus of FIG. 1 as viewed in a direction K, according to one or more exemplary embodiments. FIGS. 2B, 2C, 2D, and 2E are plan views of modified display apparatuses, according to one or more exemplary embodiments.

Referring to FIG. 2A, the through area TA may be formed between the first display area DA1 and the second display area DA2. Although not shown in detail in FIG. 2A, the first display area DA1 and the second display area DA2 may be completely spaced apart from each other. In some exemplary embodiments, the through area TA may extend to at least one edge of the display apparatus 100.

Figure 2B:
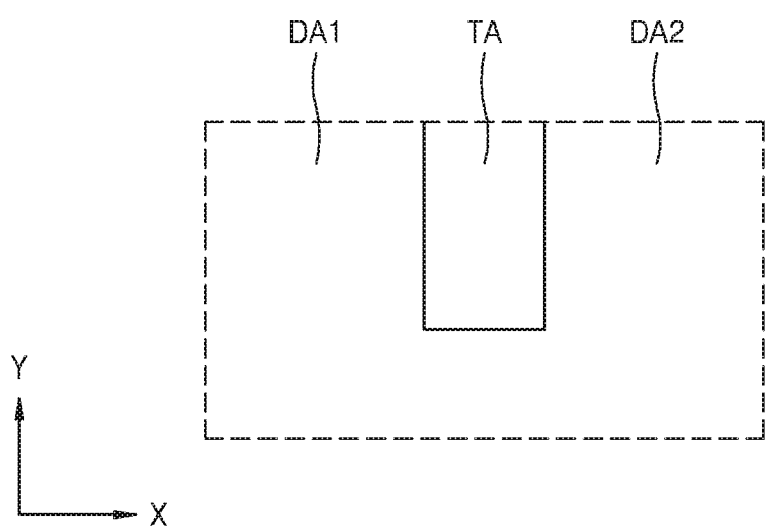
FIGS. 2B, 2C, 2D, and 2E are plan views of modified display apparatuses, according to one or more exemplary embodiments.

In a modified example, referring to FIG. 2B, the first display area DA1 and the second display area DA2 may be spaced apart from each other by the through area TA and may be connected to each other in an area other than the through area TA. In another modified example, referring to FIG. 2C, the through area TA may be surrounded by the first display area DA1 and the second display area DA2. To this end, the first display area DA1 and the second display area DA2 may be connected to each other. A boundary line of the through area TA may include a curve, and, in some exemplary embodiments, may be a circular arc or a circle. In another modified example, referring to FIG. 2D, an area of the edge of the display apparatus 100 may include a curve, and, in some exemplary embodiments, may include a circular arc. In another example, the edge of the display apparatus 100 may be a circle.

Figure 2C:
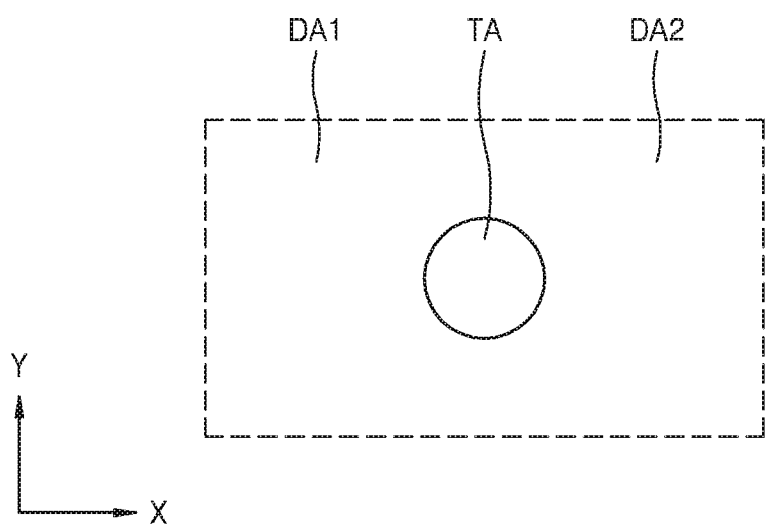
Figure 2D:
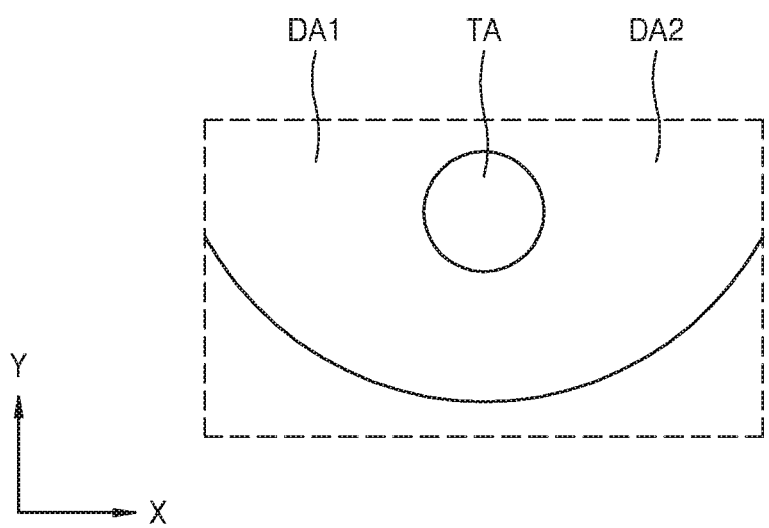
Figure 2E:
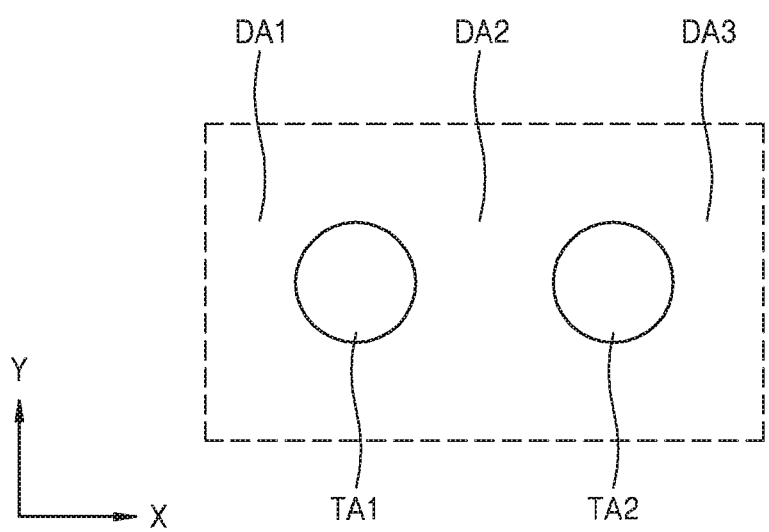

In another modified example, referring to FIG. 2E, the display apparatus 100 may include two through areas TA1 and TA2, for example, the first through area TA1 and the second through area TA2. The first through area TA1 may be between the first display area DA1 and the second display area DA2. The second through area TA2 may be between the second display area DA2 and a third display area DA3. Although not illustrated in detail, the third display area DA3 may include the same elements as the first display area DA1 or the second display area DA2, e.g., a third display unit and a third encapsulation unit. The second through area TA2 may be similar to the first through area TA1. Shapes of the second display area DA2 and the third display area DA3 in an area neighboring the second through area TA2 may be the same as the first display area DA1 and the second display area DA2 in an area neighboring the first through area TA1.

Although not shown, the display apparatus 100 may include three or more through areas TA. The shapes of FIGS. 2A through 2E may be applied to not only the display apparatus 100 of FIG. 1, but also to display apparatuses 200, 300, 400, 500, 600, and 700 that will be described below in association with FIGS. 4, 5, 8, 9, 10, 11, and 12. In the exemplary embodiments and the modified examples described above, and the exemplary embodiments and the modified examples that will be described below, the first display area DA1 and the second display area DA2 may include different materials and/or the same material.

When the first display area DA1 and the second display area DA2 include the same material, in some exemplary embodiments, the first display area DA1 and the second display area DA2 may be simultaneously formed. That is, the first display unit DU1 and the second display unit DU2 may include the same material, and the first encapsulation unit EU1 and the second encapsulation unit EU2 may include the same material. When the first display unit DU1 and the second display unit DU2 include the same material, in some exemplary embodiments, the first display unit DU1 and the second display unit DU2 may be simultaneously formed. When the first encapsulation unit EU1 and the second encapsulation unit EU2 include the same material, the first encapsulation unit EU1 and the second encapsulation unit EU2 may be simultaneously formed.

The display apparatus 100 may include the first display area DA1, the second display area DA2, and the through area TA between the first display area DA1 and the second display area DA2. The display apparatus 100 may be capable of adding various functions via the through area TA. For instance, the through area TA may be a space for a separate member (or component) for a function of the display apparatus 100 or a separate member for adding a new function to the display apparatus 100, thereby improving user convenience.

According to one or more exemplary embodiments, the first display area DA1 may include the first display unit DU1 and the first encapsulation unit EU1, and the first encapsulation unit EU1 may extend to cover one area of the side of at least the first display unit DU1 corresponding to the through area TA. In this manner, the first encapsulation unit EU1 may effectively protect the first display unit DU1, and, in particular, protect the first display unit DU1 from external shock, impurities, air, moisture, debris, etc., in the area of the first display unit DU1 corresponding to the through area TA. When the first encapsulation unit EU1 selectively covers the whole area of the side of the first display area DA1 corresponding to the through area TA, an effect of protecting the first display unit DU1 may increase.

The second display area DA2 may include the second display unit DU2 and the second encapsulation unit EU2, and the second encapsulation unit EU2 may extend to cover one area of the side of at least the second display unit DU2 corresponding to the through area TA. In this manner, the second encapsulation unit EU2 may effectively protect the second display unit DU2, and, in particular, protect the second display unit DU2 from external shock, impurities, air, moisture, debris, etc., in the area of the second display unit DU2 corresponding to the through area TA. When the second encapsulation unit EU2 selectively covers the whole area of the side of the second display area DA2 corresponding to the through area TA, an effect of protecting the second display unit DU2 may increase.

Figure 4:
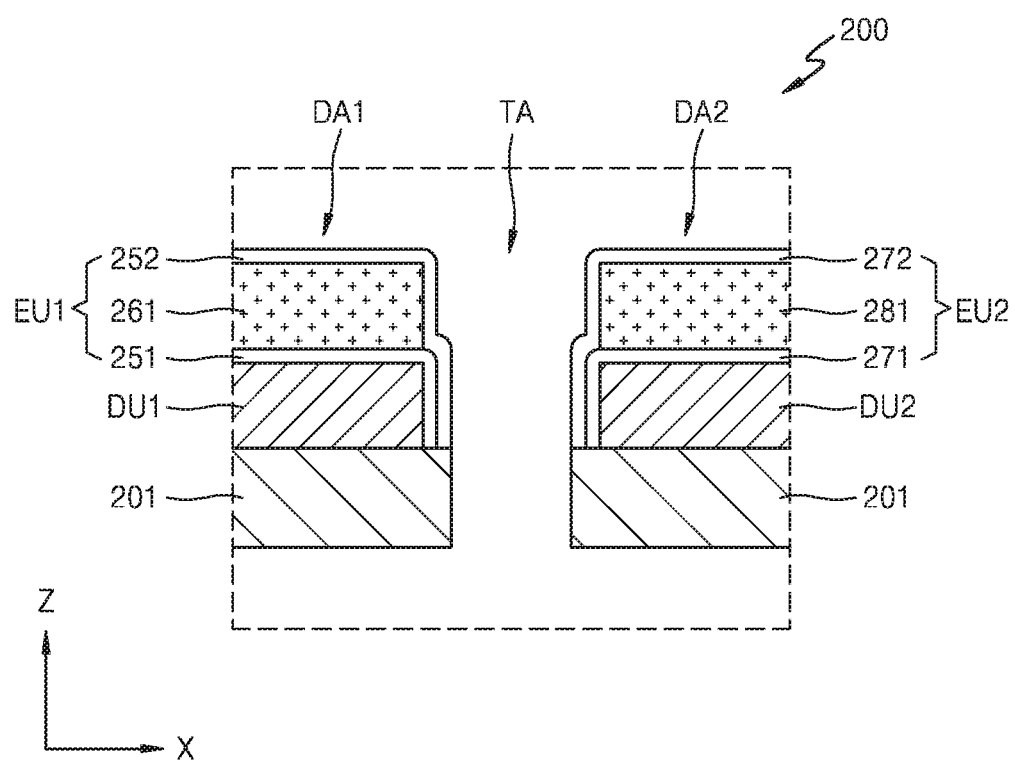
FIG. 4 is a schematic cross-sectional view of a display apparatus, according to one or more exemplary embodiments.

FIG. 4 is a schematic cross-sectional view of a display apparatus, according to one or more exemplary embodiments.

Referring to FIG. 4, the display apparatus 200 may include the first display area DA1, the second display area DA2, and the through area TA. The through area TA may be disposed between the first display area DA1 and the second display area DA2. In some exemplary embodiments, the display apparatus 200 may include a substrate 201 on which the first display area DA1 and the second display area DA2 may be formed. In this manner, the substrate 201 may enable relatively easy formation of the first display area DA1 and the second display area DA2, as well as improve the durability of the display apparatus 100. The substrate 201 may include any suitable material, such as the materials described in association with substrate 101.

The through area TA may have a shape corresponding to the whole thickness of the substrate 201. That is, the through area TA may extend through the thickness of the substrate 201. Although not shown, in some exemplary embodiments, the through area TA may be formed to correspond to only a part of the thickness of the substrate 201. In this manner, the thickness of an area of the substrate 201 corresponding to the through area TA may be smaller than the thickness of another area of the substrate 201. The first display area DA1 and the second display area DA2 will now be described in more detail below.

The first display area DA1 may include the first display unit DU1 and the first encapsulation unit EU1. The first display area DA1 may be formed on the substrate 201 and may be configured to generate light. A user may recognize the light generated by the first display unit DU1. To this end, the first display unit DU1 may include one or more display devices. For example, the first display unit DU1 may include an organic light-emitting device. The organic light-emitting device may be configured as described in association with the organic light-emitting device of the display apparatus 100 of FIG. 1, and, as such, a detailed description thereof is omitted.

The first encapsulation unit EU1 may include a first encapsulation layer 251, a second encapsulation layer 252, and an intermediate encapsulation layer 261. Although not shown, in some exemplary embodiments, the first encapsulation layer 251 may include various numbers of encapsulation layers. This may apply to the second encapsulation unit EU2 that will be described below. The first encapsulation layer 251 may be formed on the first display unit DU1 and may have an extending shape to correspond to the through area TA. That is, the first encapsulation layer 251 may be formed to at least partially cover a side of the area of the first display unit DU1 neighboring the through area TA.

In some exemplary embodiments, the first encapsulation layer 251 may be formed to completely cover the side of the area of the first display unit DU1 neighboring the through area TA. In some exemplary embodiments, the first encapsulation layer 251 may include any suitable insulating material. In some exemplary embodiments, the first encapsulation layer 251 may include an inorganic material. In some exemplary embodiments, the first encapsulation layer 251 may include an oxide or nitride material. For example, the first encapsulation layer 251 may include silicon nitride ($SiN_x$), silicon oxide ($SiO_x$), or silicon oxynitride ($SiO_xN_y$). In some exemplary embodiments, the first encapsulation layer 251 may include an organic material. In some exemplary embodiments, the first encapsulation layer 251 may extend to a top surface of the substrate 201. In some exemplary embodiments, the first encapsulation layer 251 may be spaced apart from a side of the area of the substrate 201 corresponding to the through area TA.

The intermediate encapsulation layer 261 may at least overlap with the first display unit DU1 and may be formed on the first encapsulation layer 251. In some exemplary embodiments, a top surface of the intermediate encapsulation layer 261 may include a planar surface. In some exemplary embodiments, an edge of the area of the intermediate encapsulation layer 261 neighboring the through area TA may not be over an edge of the first encapsulation layer 251 neighboring the through area TA. In some exemplary embodiments, the intermediate encapsulation layer 261 may include an inorganic material.

The second encapsulation layer 252 may be formed on the intermediate encapsulation layer 261 and the first display unit DU1. The second encapsulation layer 252 may have an extending shape to correspond to the through area TA. That is, the second encapsulation layer 252 may be formed to at least partially cover the side of the area of the first display unit DU1 neighboring the through area TA. In some exemplary embodiments, the second encapsulation layer 252 may be formed to completely cover the side of the area of the first display unit DU1 neighboring the through area TA. In some exemplary embodiments, the second encapsulation layer 252 may contact the first encapsulation layer 251 in an area disposed adjacent to at least the through area TA. In some exemplary embodiments, the second encapsulation layer 252 may cover the first encapsulation layer 251, and the first encapsulation layer 251 may not be exposed by the second encapsulation layer 252 in the through area TA. In some exemplary embodiments, the second encapsulation layer 252 may include any suitable insulating materials. In some exemplary embodiments, the second encapsulation layer 252 may include an inorganic material. In some exemplary embodiments, the second encapsulation layer 252 may include an oxide or nitride material. For example, the second encapsulation layer 252 may include silicon nitride ($SiN_x$), silicon oxide ($SiO_x$), or silicon oxynitride ($SiO_xN_y$). In some exemplary embodiments, the second encapsulation layer 252 may include an organic material.

In some exemplary embodiments, the second encapsulation layer 252 may extend to the top surface of the substrate 201. In some exemplary embodiments, at least one of the first encapsulation layer 251, the second encapsulation layer 252, and the intermediate encapsulation layer 261 may include a metal material. In some exemplary embodiments, the second encapsulation layer 252 may be spaced apart from a side of the area of the substrate 201 corresponding to the through area TA. In some exemplary embodiments, the second encapsulation layer 252 may include the same material as that of the first encapsulation layer 251, and, as such, the first encapsulation layer 251 and the second encapsulation layer 252 may easily contact one another in an area neighboring the through area TA. In this manner, the first encapsulation layer 251 and the second encapsulation layer 252 may easily reduce or block moisture, impurities, external air, debris, etc., from the first display unit DU1 in the through area TA. In some exemplary embodiments, the intermediate encapsulation layer 261 may be surrounded by the first encapsulation layer 251 and the second encapsulation layer 252.

The second display area DA2 may include the second display unit DU2 and the second encapsulation unit EU2. The second display unit DU2 may be formed on the substrate 201 and may be configured to generate light. A user may recognize the light generated by the second display unit DU2. To this end, the second display unit DU2 may include one or more display devices. For example, the second display unit DU2 may include an organic light-emitting device. The organic light-emitting device may be configured similarly to the organic light-emitting device of the display apparatus 100, and, therefore, a detailed description thereof is omitted.

The second encapsulation unit EU2 may include a first encapsulation layer 271, a second encapsulation layer 272, and an intermediate encapsulation layer 281. The first encapsulation layer 271 may be formed on the second display unit DU2 and may have an extending shape to correspond to the through area TA. That is, the first encapsulation layer 271 may be formed to at least partially cover a side of the area of the second display unit DU2 neighboring the through area TA. In some exemplary embodiments, the first encapsulation layer 271 may be formed to completely cover the side of the area of the second display unit DU2 neighboring the through area TA. In some exemplary embodiments, the first encapsulation layer 271 may include any suitable insulating material. In some exemplary embodiments, the first encapsulation layer 271 may include an inorganic material. In some exemplary embodiments, the first encapsulation layer 271 may include an oxide or nitride material. For example, the first encapsulation layer 271 may include silicon nitride ($SiN_x$), silicon oxide ($SiO_x$), or silicon oxynitride ($SiO_xN_y$). In some exemplary embodiments, the first encapsulation layer 271 may include an organic material.

According to one or more exemplary embodiments, the first encapsulation layer 271 may extend to a top surface of the substrate 201. In some exemplary embodiments, the first encapsulation layer 271 may be spaced apart from a side of the area of the substrate 201 corresponding to the through area TA.

The intermediate encapsulation layer 281 may at least overlap with the second display unit DU2 and may be formed on the first encapsulation layer 271. In some exemplary embodiments, a top surface of the intermediate encapsulation layer 281 may include a planar surface. In some exemplary embodiments, an edge of the area of the intermediate encapsulation layer 281 neighboring the through area TA may not be disposed over an edge of the first encapsulation layer 271 neighboring the through area TA. In some exemplary embodiments, the intermediate encapsulation layer 281 may include any suitable material. For instance, the intermediate encapsulation layer 281 may include an organic material. When the intermediate encapsulation layer 281 includes an organic material, the top surface of the intermediate encapsulation layer 281 may be easily formed as a planar surface. In some exemplary embodiments, the intermediate encapsulation layer 281 may include an inorganic material.

The second encapsulation layer 272 may be formed on the intermediate encapsulation layer 281 and the second display unit DU2. The second encapsulation layer 272 may have an extending shape to correspond to the through area TA. That is, the second encapsulation layer 272 may be formed to at least partially cover the side of the area of the second display unit DU2 neighboring the through area TA. In some exemplary embodiments, the second encapsulation layer 272 may be formed to completely cover the side of the area of the second display unit DU2 neighboring the through area TA. In some exemplary embodiments, the second encapsulation layer 272 may contact the first encapsulation layer 271 in an area at least corresponding to the through area TA.

In some exemplary embodiments, the second encapsulation layer 272 may cover the first encapsulation layer 271, and the first encapsulation layer 271 may not be exposed by the second encapsulation layer 272 in the through area TA. In some exemplary embodiments, the second encapsulation layer 272 may include any suitable insulating material. In some exemplary embodiments, the second encapsulation layer 272 may include an inorganic material. In some exemplary embodiments, the second encapsulation layer 272 may include an oxide or nitride material. For example, the second encapsulation layer 272 may include silicon nitride ($SiN_x$), silicon oxide ($SiO_x$), or silicon oxynitride ($SiO_xN_y$). In some exemplary embodiments, the second encapsulation layer 272 may include an organic material.

According to one or more exemplary embodiments, at least one of the first encapsulation layer 271, the second encapsulation layer 272, and the intermediate encapsulation layer 281 may include a metal material. In some exemplary embodiments, the second encapsulation layer 272 may extend to the top surface of the substrate 201. In some exemplary embodiments, the second encapsulation layer 272 may be spaced apart from the side of the area of the substrate 201 corresponding to the through area TA. In some exemplary embodiments, the second encapsulation layer 272 may include the same material as that of the first encapsulation layer 271, and, as such, the first encapsulation layer 271 and the second encapsulation layer 272 may easily contact in an area neighboring the through area TA. In this manner, the first encapsulation layer 271 and the second encapsulation layer 272 may easily reduce or block moisture, impurities, external air, debris, etc., from the second display unit DU2 in the through area TA.

In some exemplary embodiments, the intermediate encapsulation layer 281 may be surrounded by the first encapsulation layer 271 and the second encapsulation layer 272. As described above, the first encapsulation unit EU1 and the second encapsulation unit EU2 may include the same material as one another, and may be simultaneously formed. That is, the first encapsulation layer 251 of the first display area DA1 and the first encapsulation layer 271 of the second display area DA2 may include the same material as one another, and may be selectively simultaneously formed with one another. The intermediate encapsulation layer 261 of the first display area DA1 and the intermediate encapsulation layer 281 of the second display area DA2 may include the same material as one another, and may be selectively simultaneously formed.

According to one or more exemplary embodiments, the display apparatus 200 may include the first display area DA1, the second display area DA2, and the through area TA disposed between the first display area DA1 and the second display area DA2. The display apparatus 200 may be capable of adding various functions via the through area TA. That is, the through area TA may be a space for a separate member (or component) for a function of the display apparatus 200 or a separate member for adding a new function to the display apparatus 200. In this manner, the through area TA may enable improved user convenience.

According to one or more exemplary embodiments, the first display area DA1 may include the first display unit DU1 and the first encapsulation unit EU1, and the first encapsulation layer 251 or the second encapsulation layer 252 of the first encapsulation unit EU1 may extend to cover one area of the side of at least the first display unit DU1 corresponding to the through area TA. In this manner, the first encapsulation unit EU1 may effectively protect the first display unit DU1, and, in particular, protect the first display unit DU1 from external shock, impurities, air, moisture, debris, etc., in the area of the first display unit DU1 corresponding to the through area TA. When the first encapsulation layer 251 or the second encapsulation layer 252 covers the whole area of the side of the first display area DA1 corresponding to the through area TA, an effect of protecting the first display unit DU1 may increase.

The intermediate encapsulation layer 261 may be formed between the first encapsulation layer 251 and the second encapsulation layer 252, and, may, thereby improve an encapsulation characteristic of the first encapsulation unit EU1 with respect to the first display unit DU1. When a top surface of the intermediate encapsulation layer 261 selectively includes a planar surface, the second encapsulation layer 252 may be planar, and a top surface of the display apparatus 200 may be easily manufactured to be planar too.

According to one or more exemplary embodiments, the second display area DA2 may include the second display unit DU2 and the second encapsulation unit EU2, and the first encapsulation layer 271 and/or the second encapsulation layer 272 of the second encapsulation unit EU2 may extend to cover one area of the side of at least the second display unit DU2 corresponding to the through area TA. In this manner, the second encapsulation unit EU2 may effectively protect the second display unit DU2, and, in particular, may protect the second display unit DU2 from external shock, impurities, air, moisture, debris, etc., in the area of the second display unit DU2 corresponding to the through area TA. When the first encapsulation layer 271 or the second encapsulation layer 272 selectively covers the area of the side of the second display area DA2 corresponding to the through area TA, an effect of protecting the second display unit DU2 may be increased.

The intermediate encapsulation layer 281 may be formed between the first encapsulation layer 271 and the second encapsulation layer 272, and, may, thereby improve an encapsulation characteristic of the second encapsulation unit EU2 with respect to the second display unit DU2. When a top surface of the intermediate encapsulation layer 281 selectively includes a planar surface, the second encapsulation layer 272 may be planar, and the top surface of the display apparatus 200 may be easily manufactured to include a planar surface too.

Figure 5:
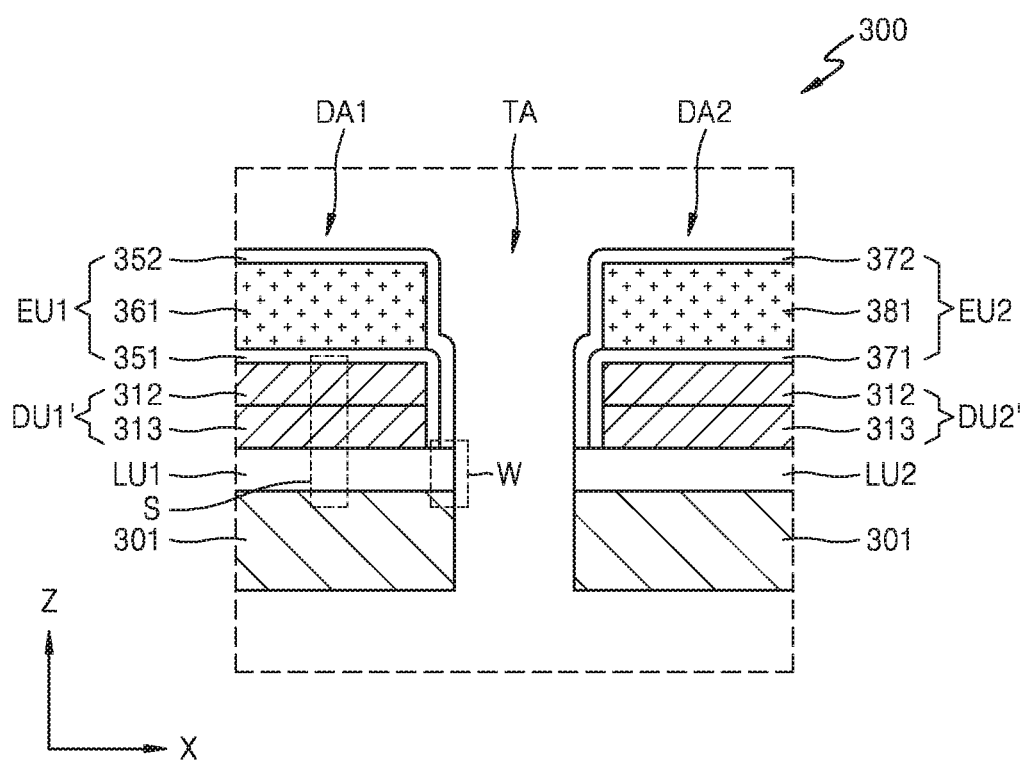
FIG. 5 is a schematic cross-sectional view of a display apparatus, according to one or more exemplary embodiments.
Figure 6:
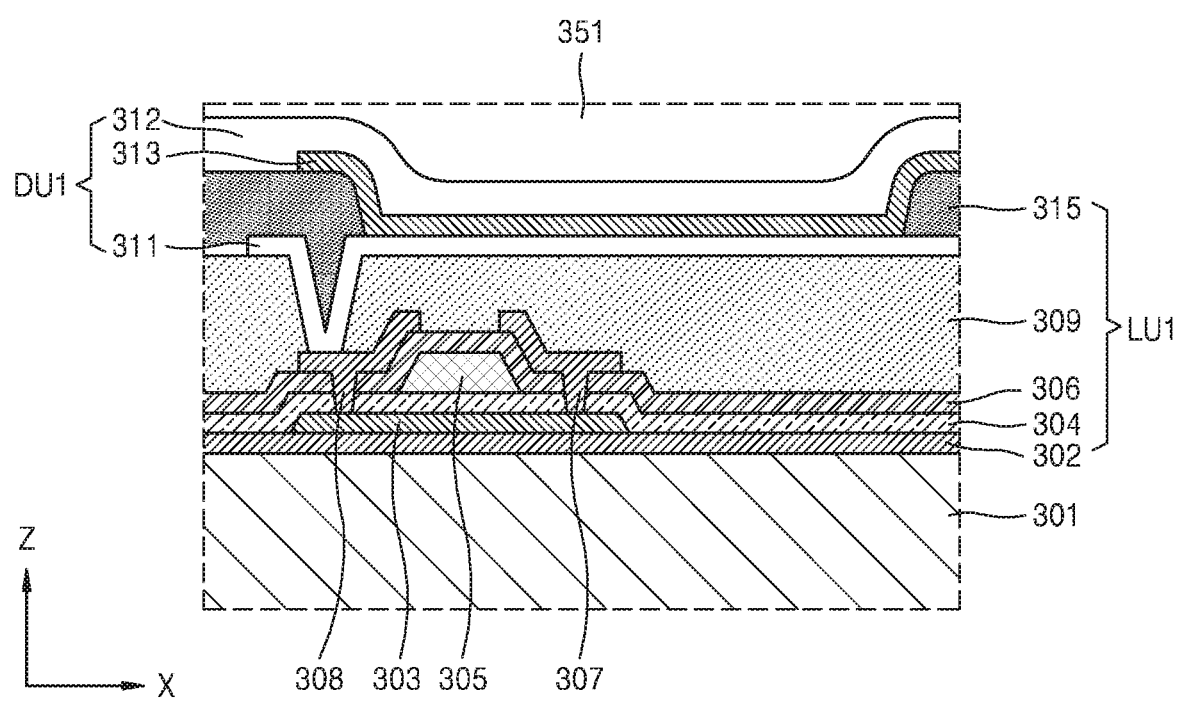
FIG. 6 is an enlarged cross-sectional view of region S of the display apparatus of FIG. 5, according to one or more exemplary embodiments.
Figure 7:
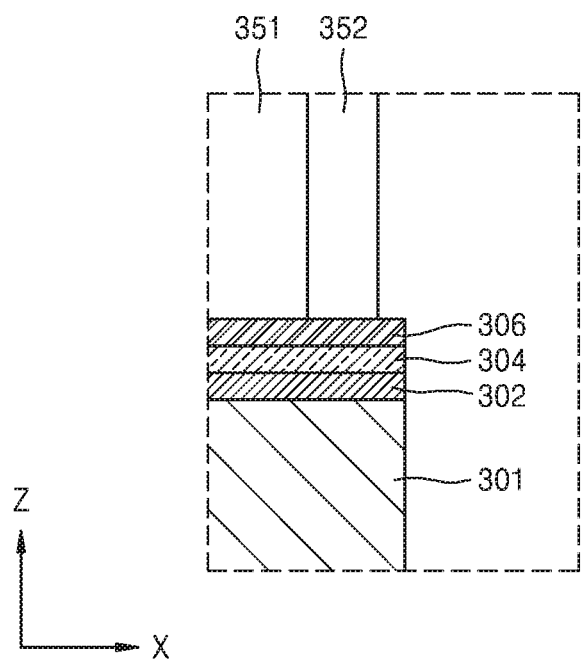
FIG. 7 is an enlarged cross-sectional view of region W of the display apparatus of FIG. 5, according to one or more exemplary embodiments.

FIG. 5 is a schematic cross-sectional view of a display apparatus, according to one or more exemplary embodiments. FIG. 6 is an enlarged cross-sectional view of region S of the display apparatus of FIG. 5, according to one or more exemplary embodiments. FIG. 7 is an enlarged cross-sectional view of region W of the display apparatus of FIG. 5, according to one or more exemplary embodiments.

Referring to FIGS. 5 through 7, the display apparatus 300 may include the first display area DA1, the second display area DA2, and the through area TA. The through area TA may be disposed between the first display area DA1 and the second display area DA2. The first display area DA1 may include a first lower structure LU1, and the second display area DA2 may include a second lower structure LU2.

A part DU1' of a first display unit DU1 may be formed on the first lower structure LU1. For example, the part DU1' of the first display unit DU1 may include at least an intermediate layer 313 and a second electrode 312 of the first display unit DU1. In some exemplary embodiments, the first lower structure LU1 may include a first electrode 311 of the first display unit DU1. In some exemplary embodiments, the first lower structure LU1 may include one or more thin film transistors and one or more insulating layers that are disposed on the first electrode 311, which will be described in more detail below.

A part DU2' of a second display unit DU2 may be formed on the second lower structure LU2. For example, the part DU2' of the second display unit DU2 may include at least the intermediate layer 313 and the second electrode 312 of the second display unit DU2. In some exemplary embodiments, the second lower structure LU2 may include a first electrode (not shown) of the second display unit DU2. In some exemplary embodiments, the second lower structure LU2 may include one or more thin film transistors (not shown) and one or more insulating layers (not shown) that are disposed on the first electrode. The configuration of the second display unit DU2 may be substantially similar to the configuration of the first display unit DU1, and, as such, a description of the second lower structure LU2 is omitted, but may be substantially similar to the description of the first lower structure LU1.

In some exemplary embodiments, the display apparatus 300 may include a substrate 301 on which the first display area DA1 and the second display area DA2 are formed. In this manner, the substrate 301 may enable the first display area DA1 and the second display area DA2 to be easily formed, and may improve the durability of the display apparatus 300.

As seen in FIG. 5, the first lower structure LU1 and the second lower structure LU2 may be formed on the substrate 301. The substrate 301 may include any suitable material, such as those materials described in association with substrate 101. The first lower structure LU1 will be described in more detail with reference to FIG. 6. The second lower structure LU2 may be substantially the same as the first lower structure LU1, and, as such, a detailed description of the second lower structure LU2 is omitted.

Referring to FIG. 6, the first lower structure LU1 may include the first electrode 311 and a thin film transistor connected to the first electrode 311. The thin film transistor may have various functions, and, for example, may transmit an electrical signal to the first display unit DU1. The thin film transistor may include an active layer 303, a gate electrode 305, a source electrode 307, and a drain electrode 308. As seen in FIG. 6, the gate electrode 305 is a top gate-type electrode formed on the active layer 303. It is contemplated, however, that the first lower structure LU1 may include a bottom gate-type electrode.

The active layer 303 may be formed on the substrate 301. In some exemplary embodiments, a buffer layer 302 may be formed between the substrate 301 and the active layer 303. The buffer layer 302 may reduce or block penetration of impurities, moisture, external air, etc., into a lower portion of the substrate 301, and may provide a planar surface on a top surface of the substrate 301. The buffer layer 302 may include any suitable insulating material, such as, for example, an inorganic material, e.g., an oxide or nitride material. For instance, the buffer layer 302 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc.

The active layer 303 may be formed on the buffer layer 302. The active layer 303 may include any suitable semiconductor material, such as, for example, amorphous silicon, polycrystalline silicon, etc. It is contemplated, however, that exemplary embodiments are not limited thereto, and the active layer 303 may include any suitable material. In some exemplary embodiments, the active layer 303 may include an organic semiconductor material. In some exemplary embodiments, the active layer 303 may include an oxide semiconductor material.

The gate insulating layer 304 may be formed on the active layer 303. The gate insulating layer 304 may include any suitable insulating material, and, in some exemplary embodiments, may include an inorganic material. For example, the gate insulating layer 304 may include an oxide or nitride material. For instance, the gate insulating layer 304 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. The gate insulating layer 304 may insulate the active layer 303 and the gate electrode 305 from each other. The gate electrode 305 may be provided on the gate insulating layer 304. The gate electrode 305 may include a low resistance metal material. For example, the gate electrode 305 may include a conductive material including molybdenum (Mo), aluminum (Al), copper (Cu), titanium (Ti), etc., and may be formed as a multilayer or a single layer.

An interlayer insulating layer 306 may be formed on the gate electrode 305. The interlayer insulating layer 306 may insulate the source electrode 307 and the drain electrode 308 from the gate electrode 305.

The interlayer insulating layer 306 may include any suitable insulating material, and, in some exemplary embodiments, may include an inorganic material. For example, the interlayer insulating layer 306 may include an oxide or nitride material. For instance, the interlayer insulating layer 306 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc. The source electrode 307 and the drain electrode 308 may be formed on the interlayer insulating layer 306. The source electrode 307 and the drain electrode 308 may be formed as a single layer or a multilayer using a highly conductive material. The source electrode 307 and the drain electrode 308 may contact the active layer 303.

A passivation layer 309 may be formed on the source electrode 307 and the drain electrode 308. The passivation layer 309 may remove a step caused by the thin film transistor, and may provide a planar surface on a top surface of the thin film transistor. The passivation layer 309 may protect the source electrode 307 and the drain electrode 308. The passivation layer 309 may include any suitable material. In some exemplary embodiments, the passivation layer 309 may include an organic material and may be formed as single layer or multiple layers.

In some exemplary embodiments, the passivation layer 309 may include polymer derivatives having commercial polymers, such as polymethyl methacrylate (PMMA) or polystyrene (PS), and a phenol group, an acryl-based polymer, an imide-based polymer, an arylene ether-based polymer, an amide-based polymer, a fluorine-based polymer, a p-xylene-based polymer, a vinyl alcohol-based polymer, etc., or a combination thereof. The passivation layer 309 may be formed as a stack including an inorganic insulating layer and an organic insulating layer.

The first display unit DU1 may be formed on the passivation layer 309. The first display unit DU1 may be electrically connected to the thin film transistor. The first display unit DU1 may include the first electrode 311, the second electrode 312, and the intermediate layer 313 disposed between the first electrode 311 and the second electrode 312. That is, the first display unit DU1 may be an organic light-emitting device. The first electrode 311 may be electrically connected to one of the source electrode 307 and the drain electrode 308. As shown in FIG. 6, the first electrode 311 is electrically connected to the drain electrode 308. The first electrode 311 may have various forms. For example, the first electrode 311 may include an island-shaped pattern.

A pixel-defining layer 315 may be formed on the passivation layer 309. The pixel-defining layer 315 may be formed to not cover a predetermined area of the first electrode 311. The intermediate layer 313 may be formed on the area of the first electrode 311 that is not covered by the pixel-defining layer 315. The second electrode 312 may be formed on the intermediate layer 313. The pixel-defining layer 315 may include one or more organic insulating materials selected from the group consisting of polyimide, polyamide, an acryl resin, benzocyclobutene, and a phenol resin by using a spin coating method.

Although not illustrated, on the second electrode 312, in some exemplary embodiments, a functional layer (not shown) may be formed thereon. The functional layer may include a plurality of layers formed on the second electrode 312. At least one layer of the functional layer may prevent contamination of the second electrode 312 in a subsequent process, and another layer of the functional layer may improve the efficiency of a visible ray that is discharged from the intermediate layer 313 to the second electrode 312. That is, for example, the functional layer may include a capping layer. The capping layer may protect the second electrode 312 and may be formed to control a refractive index of the visible ray implemented by the first display unit DU1 to improve light efficiency.

According to one or more exemplary embodiments, the functional layer may include a cover layer on the capping layer. The cover layer may include, for example, lithium fluoride (LiF), may protect the second electrode 312, may improve light efficiency, and may protect a top surface of the capping layer. The aforementioned description of the functional layer may selectively apply to other exemplary embodiments described herein.

Descriptions of materials used to form the first electrode 311, the second electrode 312, and the intermediate layer 313 disposed between the first electrode 311 and the second electrode 312 are the same as described in the exemplary embodiments above, and, as such, detailed descriptions thereof are omitted.

According to one or more exemplary embodiments, the through area TA may have a shape corresponding to the thickness of the substrate 301. That is, the through area TA may extend through the thickness of the substrate 301. Although not shown, in some exemplary embodiments, the through area TA may be formed to correspond to only a part of the thickness of the substrate 301. In this manner, a thickness of an area of the substrate 301 corresponding to the through area TA may be smaller than that of another area of the substrate 301.

The first display area DA1 may include the first encapsulation unit EU1 formed on the first display unit DU1. The first encapsulation unit EU1 may include a first encapsulation layer 351, a second encapsulation layer 352, and an intermediate encapsulation layer 361. The first encapsulation layer 351 may be formed on the first display unit DU1 and may have an extending shape to correspond to the through area TA. That is, the first encapsulation layer 351 may be formed on the second electrode 312 of the first display unit DU1, and may be formed to at least partially cover a side of the area of the first display unit DU1 neighboring the through area TA. In some exemplary embodiments, the first encapsulation layer 351 may be formed to completely cover sides of areas of the intermediate layer 313 and the second electrode 312 of the first display unit DU1 neighboring the through area TA.

The first encapsulation layer 351 may include any suitable insulating material. In some exemplary embodiments, the first encapsulation layer 351 may include an inorganic material. In some exemplary embodiments, the first encapsulation layer 351 may include an oxide or nitride material. For instance, the first encapsulation layer 351 may include silicon nitride ($SiN_x$), silicon oxide ($SiO_x$), or silicon oxynitride ($SiO_xN_y$). In some exemplary embodiments, the first encapsulation layer 351 may include an organic material.

In some exemplary embodiments, the first encapsulation layer 351 may extend to a top surface of the substrate 301. In some exemplary embodiments, the first encapsulation layer 351 may be spaced apart from a side of the area of the substrate 301 corresponding to the through area TA. In some exemplary embodiments, the first encapsulation layer 351 may contact one of the insulating layers of the first lower structure LU1. That is, as shown in FIG. 7, the first encapsulation layer 351 may contact the interlayer insulating layer 306 of the first lower structure LU1. The first encapsulation layer 351 and the interlayer insulating layer 306 may contact each other, thereby improving an encapsulation characteristic of the first encapsulation unit EU1 with respect to the first display unit DU1. In this regard, a side of the interlayer insulating layer 306 facing the through area TA may not be covered by the first encapsulation layer 351. In some exemplary embodiments, the first encapsulation layer 351 may contact the gate insulating layer 304 or the buffer layer 302. To this end, a side of the gate insulating layer 304 or the buffer layer 302 facing toward the through area TA may not be covered by the first encapsulation layer 351.

According to one or more exemplary embodiments, as shown in FIG. 7, the interlayer insulating layer 306, the gate insulating layer 304, and the buffer layer 302 may be closer to the through area TA than the first encapsulation layer 351. That is, edges of the interlayer insulating layer 306, the gate insulating layer 304, and the buffer layer 302 may extend closer to the through area TA than an edge of the first encapsulation layer 351 in an area corresponding to the through area TA. The edges of the interlayer insulating layer 306, the gate insulating layer 304, and the buffer layer 302 are illustrated in FIG. 7. That is, the interlayer insulating layer 306, the gate insulating layer 304, and the buffer layer 302 may extend toward the through area TA, such that the interlayer insulating layer 306, the gate insulating layer 304, and the buffer layer 302 may be at least closer to the through area TA than the first display unit DU1. However, exemplary embodiments are not limited thereto. One of the interlayer insulating layer 306, the gate insulating layer 304, and the buffer layer 302 may extend toward the through area TA, such that one of the interlayer insulating layer 306, the gate insulating layer 304, and the buffer layer 302 may be closer to the through area TA than the first display unit DU1.

Another insulating layer of the first lower structure LU1, for example, the passivation layer 309 or the pixel-defining layer 315, may extend toward the through area TA, such that the other insulating layer may be closer to the through area TA than the first display unit DU1. The intermediate encapsulation layer 361 may at least overlap the first display unit DU1 and may be formed on the first encapsulation layer 351. In some exemplary embodiments, a top surface of the intermediate encapsulation layer 361 may include a planar surface. In some exemplary embodiments, an edge of the area of the intermediate encapsulation layer 361 neighboring the through area TA may not be disposed over an edge of the first encapsulation layer 351 neighboring the through area TA.

According to one or more exemplary embodiments, the intermediate encapsulation layer 361 may include any suitable material. The intermediate encapsulation layer 361 may include an organic material. When the intermediate encapsulation layer 361 includes an organic material, the top surface of the intermediate encapsulation layer 361 may be easily formed as a planar surface. In some exemplary embodiments, the intermediate encapsulation layer 361 may include an inorganic material.

The second encapsulation layer 352 may be formed on the intermediate encapsulation layer 361 and the first display unit DU1. To this end, the second encapsulation layer 352 may have an extending shape to correspond to the through area TA. That is, the second encapsulation layer 352 may be formed to at least partially cover the side of the area of the first display unit DU1 neighboring the through area TA. In some exemplary embodiments, the second encapsulation layer 352 may be formed to completely cover the sides of the areas of the intermediate layer 313 and the second electrode 312 of the first display unit DU1 neighboring the through area TA. In some exemplary embodiments, the second encapsulation layer 352 may contact the first encapsulation layer 351 in an area toward at least the through area TA.

In some exemplary embodiments, the second encapsulation layer 352 may cover the first encapsulation layer 351, and the first encapsulation layer 351 may not be exposed by the second encapsulation layer 352 in the through area TA. In some exemplary embodiments, the second encapsulation layer 352 may include any suitable insulating material. In some exemplary embodiments, the second encapsulation layer 352 may include an inorganic material. In some exemplary embodiments, the second encapsulation layer 352 may include an oxide or nitride material. For instance, the second encapsulation layer 352 may include silicon nitride ($SiN_x$), silicon oxide ($SiO_x$), or silicon oxynitride ($SiO_xN_y$). In some exemplary embodiments, the second encapsulation layer 352 may include an organic material.

In some exemplary embodiments, at least one of the first encapsulation layer 351, the second encapsulation layer 352, and the intermediate encapsulation layer 361 may include a metal material. In some exemplary embodiments, the second encapsulation layer 352 may extend to the top surface of the substrate 301. In some exemplary embodiments, the second encapsulation layer 352 may be spaced apart from the side of the area of the substrate 301 corresponding to the through area TA. In some exemplary embodiments, the second encapsulation layer 352 may contact one of the insulating layers of the first lower structure LU1. That is, as shown in FIG. 7, the second encapsulation layer 352 may contact the interlayer insulating layer 306 of the first lower structure LU1.

The second encapsulation layer 352 and the interlayer insulating layer 306 may contact each other, thereby improving an encapsulation characteristic of the first encapsulation unit EU1 with respect to the first display unit DU1. In this manner, a side of the interlayer insulating layer 306 facing the through area TA may not be covered by the second encapsulation layer 352. In some exemplary embodiments, the second encapsulation layer 352 may contact the gate insulating layer 304 or the buffer layer 302. In this manner, a side of the gate insulating layer 304 or the buffer layer 302 facing the through area TA may not be covered by the second encapsulation layer 352.

In some exemplary embodiments, the interlayer insulating layer 306, the gate insulating layer 304, and the buffer layer 302 may be closer to the through area TA than the second encapsulation layer 352. That is, edges of the interlayer insulating layer 306, the gate insulating layer 304, and the buffer layer 302 may extend more towards the through area TA than an edge of the second encapsulation layer 352 in an area corresponding to the through area TA. It is contemplated, however, that exemplary embodiments are not limited thereto. The edges of the interlayer insulating layer 306, the gate insulating layer 304, and the buffer layer 302 may extend more towards the through area TA than or the same as the edge of the second encapsulation layer 352 in the area corresponding to the through area TA.

The edges of the interlayer insulating layer 306, the gate insulating layer 304, and the buffer layer 302 are illustrated in FIG. 7. That is, the interlayer insulating layer 306, the gate insulating layer 304, and the buffer layer 302 may extend toward the through area TA, such that the interlayer insulating layer 306, the gate insulating layer 304, and the buffer layer 302 may be at least closer to the through area TA than the first display unit DU1. However, exemplary embodiments are not limited thereto. One of the interlayer insulating layer 306, the gate insulating layer 304, and the buffer layer 302 may extend toward the through area TA, such that one of the interlayer insulating layer 306, the gate insulating layer 304, and the buffer layer 302 may be closer to the through area TA than the first display unit DU1.

Another insulating layer of the first lower structure LU1, for example, the passivation layer 309 or the pixel-defining layer 315, may extend toward the through area TA, such that the other insulating layer may be closer to the through area TA than the first display unit DU1. In some exemplary embodiments, the second encapsulation layer 352 may include the same material as that of the first encapsulation layer 351, and, as such, the first encapsulation layer 351 and the second encapsulation layer 352 may easily contact each other in the area neighboring the through area TA. In this manner, the first encapsulation layer 351 and the second encapsulation layer 352 may easily reduce or block moisture, impurities, external air, debris, etc. from the first display unit DU1 in the through area TA. In some exemplary embodiments, the intermediate encapsulation layer 361 may be surrounded by the first encapsulation layer 351 and the second encapsulation layer 352.

The second display area DA2 may include the second encapsulation unit EU2 formed on the second display unit. The second encapsulation unit EU2 may include a first encapsulation layer 371, a second encapsulation layer 372, and an intermediate encapsulation layer 381. The first encapsulation layer 371 may be formed on the second display unit DU2 and may have an extending shape to correspond to the through area TA. That is, the first encapsulation layer 371 may be formed on the second electrode 312 of the second display unit DU2 and may be formed to at least partially cover a side of the area of the second display unit DU2 neighboring the through area TA. In some exemplary embodiments, the first encapsulation layer 371 may be formed to completely cover sides of areas of the intermediate layer 313 and the second electrode 312 of the second display unit DU2 neighboring the through area TA.

In some exemplary embodiments, the first encapsulation layer 371 may include any suitable insulating material. In some exemplary embodiments, the first encapsulation layer 371 may include an inorganic material. In some exemplary embodiments, the first encapsulation layer 371 may include an oxide or nitride material. For example, the first encapsulation layer 371 may include silicon nitride ($SiN_x$), silicon oxide ($SiO_x$), or silicon oxynitride ($SiO_xN_y$). In some exemplary embodiments, the first encapsulation layer 371 may include an organic material.

According to one or more exemplary embodiments, the first encapsulation layer 371 may extend to the top surface of the substrate 301. In some exemplary embodiments, the first encapsulation layer 371 may be spaced apart from the side of the area of the substrate 301 corresponding to the through area TA. Although not provided, a description of the first encapsulation layer 351 of the first display area DA1 provided with reference to FIG. 7, i.e., a description in connection with the first lower structure LU1, may apply to that of the first encapsulation layer 371 of the second display area DA2, and, as such, a detailed description thereof is omitted.

The intermediate encapsulation layer 381 may at least overlap with the second display unit DU2 and may be formed on the first encapsulation layer 371. In some exemplary embodiments, a top surface of the intermediate encapsulation layer 381 may include a planar surface. In some exemplary embodiments, an edge of the area of the intermediate encapsulation layer 381 neighboring the through area TA may not be over an edge of the first encapsulation layer 371 neighboring the through area TA. In some exemplary embodiments, the intermediate encapsulation layer 381 may include any suitable material. The intermediate encapsulation layer 381 may include an organic material.

When the intermediate encapsulation layer 381 includes an organic material, the top surface of the intermediate encapsulation layer 381 may be easily formed as a planar surface. In some exemplary embodiments, the intermediate encapsulation layer 381 may include an inorganic material.

The second encapsulation layer 372 may be formed on the intermediate encapsulation layer 381 and the second display unit DU2. The second encapsulation layer 372 may have an extending shape to correspond to the through area TA. That is, the second encapsulation layer 372 may be formed to at least partially cover the side of the area of the second display unit DU2 neighboring the through area TA. In some exemplary embodiments, the second encapsulation layer 372 may be formed to completely cover the sides of the areas of the intermediate layer 313 and the second electrode 312 of the second display unit DU2 neighboring the through area TA. In some exemplary embodiments, the second encapsulation layer 372 may contact the first encapsulation layer 371 in an area facing toward at least the through area TA. In some exemplary embodiments, the second encapsulation layer 372 may cover the first encapsulation layer 371, and the first encapsulation layer 371 may not be exposed by the second encapsulation layer 372 in the through area TA.

In some exemplary embodiments, the second encapsulation layer 372 may include any suitable insulating material. In some exemplary embodiments, the second encapsulation layer 372 may include an inorganic material. In some exemplary embodiments, the second encapsulation layer 372 may include an oxide or nitride material. For example, the second encapsulation layer 372 may include silicon nitride ($SiN_x$), silicon oxide ($SiO_x$), or silicon oxynitride ($SiO_xN_y$). In some exemplary embodiments, the second encapsulation layer 372 may include an organic material.

In some exemplary embodiments, at least one of the first encapsulation layer 371, the second encapsulation layer 372, and the intermediate encapsulation layer 381 may include a metal material. In some exemplary embodiments, the second encapsulation layer 372 may extend to the top surface of the substrate 301. In some exemplary embodiments, the second encapsulation layer 372 may be spaced apart from the side of the area of the substrate 301 corresponding to the through area TA. Although not provided in association with the second encapsulation layer 372, a description of the second encapsulation layer 352 of the first display area DA1 provided with reference to FIG. 7, i.e., a description in connection with the first lower structure LU1, may apply to that of the second encapsulation layer 372 of the second display area DA2, and, as such, a detailed description thereof is omitted.

In some exemplary embodiments, the second encapsulation layer 372 may include the same material as that of the first encapsulation layer 371, and, as such, the first encapsulation layer 371 and the second encapsulation layer 372 may easily contact one another in the area neighboring the through area TA. This may easily reduce or block moisture, impurities, external air, debris, etc., from the second display unit DU2 in the through area TA. In some exemplary embodiments, the intermediate encapsulation layer 381 may be surrounded by the first encapsulation layer 371 and the second encapsulation layer 372.

As described above, the first encapsulation unit EU1 and the second encapsulation unit EU2 may include the same material as one another and may be simultaneously formed. That is, the first encapsulation layer 351 of the first display area DA1 and the first encapsulation layer 371 of the second display area DA2 may include the same material and may be selectively simultaneously formed. The second encapsulation layer 352 of the first display area DA1 and the second encapsulation layer 372 of the second display area DA2 may include the same material and may be selectively simultaneously formed. The intermediate encapsulation layer 361 of the first display area DA1 and the intermediate encapsulation layer 381 of the second display area DA2 may include the same material and may be selectively simultaneously formed.

According to one or more exemplary embodiments, the display apparatus 300 may include the first display area DA1 and the second display area DA2 and the through area TA disposed between the first display area DA1 and the second display area DA2. The display apparatus 300 may be capable of adding various functions via the through area TA. That is, the through area TA may be a space for a separate member (or component) for a function of the display apparatus 300 or a separate member for adding a new function to the display apparatus 300. This may improve user convenience.

According to one or more exemplary embodiments, the first display area DA1 may include the first display unit DU1 and the first encapsulation unit EU1, and the first encapsulation layer 351 or the second encapsulation layer 352 of the first encapsulation unit EU1 may extend to cover one area of the side of at least the first display unit DU1 corresponding to the through area TA. This may effectively protect the first display unit DU1, and, in particular, protect the first display unit DU1 from external shock, impurities, air, moisture, debris, etc., in the area of the first display unit DU1 corresponding to the through area TA. When the first encapsulation layer 351 or the second encapsulation layer 352 covers the whole area of the side of the first display area DA1 corresponding to the through area TA, an effect of protecting the first display unit DU1 may increase.

The intermediate encapsulation layer 361 may be formed between the first encapsulation layer 351 and the second encapsulation layer 352, thereby improving an encapsulation characteristic of the first encapsulation unit EU1 with respect to the first display unit DU1. When a top surface of the intermediate encapsulation layer 361 is selectively formed as a planar surface, the second encapsulation layer 352 may be planar, and a top surface of the display apparatus 300 may be easily formed as planar too.

The second display area DA2 may include the second display unit DU2 and the second encapsulation unit EU2, and the first encapsulation layer 371 or the second encapsulation layer 372 of the second encapsulation unit EU2 may extend to cover one area of the side of at least the second display unit DU2 corresponding to the through area TA. This may effectively protect the second display unit DU2, and, in particular, protect the second display unit DU2 from external shock, impurities, air, moisture, debris, etc., in the area of the second display unit DU2 corresponding to the through area TA. When the first encapsulation layer 371 or the second encapsulation layer 372 selectively covers the whole area of the side of the second display area DA2 corresponding to the through area TA, an effect of protecting the second display unit DU2 may increase.

The intermediate encapsulation layer 381 may be formed between the first encapsulation layer 371 and the second encapsulation layer 372, which may improve an encapsulation characteristic of the second encapsulation unit EU2 with respect to the second display unit DU2. When a top surface of the intermediate encapsulation layer 381 is selectively formed with a planar surface, the second encapsulation layer 372 may be planar, and the top surface of the display apparatus 300 may be easily formed as planar too.

Figure 8:
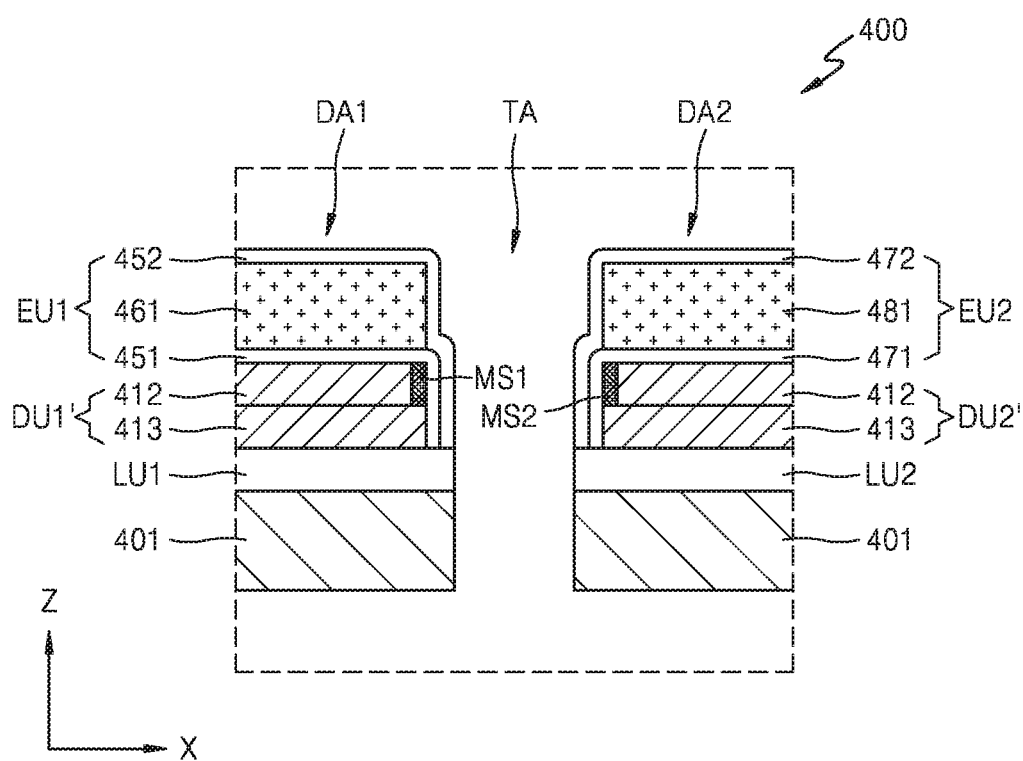
FIG. 8 is a schematic cross-sectional view of a display apparatus, according to one or more exemplary embodiments.

FIG. 8 is a schematic cross-sectional view of a display apparatus, according to one or more exemplary embodiments. When the display apparatus 400 of FIG. 8 is compared to the display apparatus 300 of FIG. 7, a first protection pattern MS1 and a second protection pattern MS2 are added to the display apparatus 400. For descriptive convenience, the differences between FIGS. 7 and 8 will be described below and similarities will be generally omitted to avoid obscuring exemplary embodiments described herein.

Referring to FIG. 8, the display apparatus 400 may include the first display area DA1, the second display area DA2, and the through area TA. The through area TA may be disposed between the first display area DA1 and the second display area DA2. The first display area DA1 of the display apparatus 400 may include the first lower structure LU1, and the second display area DA2 may include the second lower structure LU2.

The part DU1' of a first display unit DU1 may be formed on the first lower structure LU1. For example, the part DU1' of the first display unit DU1 may include at least an intermediate layer 413 and a second electrode 412 of the first display unit DU1. A description of the first lower structure LU1 is the same as described in association with the display apparatus 300, and, as such, a detailed description thereof is omitted. The part DU2' of a second display unit may DU2 be formed on the second lower structure LU2. For example, the part DU2' of the second display unit DU2 may include at least the intermediate layer 413 and the second electrode 412 of the second display unit DU2. A description of the second lower structure LU2 is the same as described in association with the display apparatus 300, and, as such, a detailed description thereof is omitted.

The first protection pattern MS1 may be formed on the intermediate layer 413 and may correspond to a side of an area of the second electrode 412 facing toward the through area TA. In some exemplary embodiments, the first protection pattern MS1 may be formed between the second electrode 412 and the first encapsulation unit EU1. For example, the first protection pattern MS1 may be formed between the second electrode 412 and a first encapsulation layer 451 of the first encapsulation unit EU1, and, as such, a side of the second electrode 412 may be spaced apart from the first encapsulation unit EU1, thereby effectively protecting the side of the second electrode 412. The first protection pattern MS1 may include any suitable material. In some exemplary embodiments, the first protection pattern MS1 may include a material that does not mix with a material forming the second electrode 412, for example, an organic material. In some exemplary embodiments, the first protection pattern MS1 may include a part of a material forming the intermediate layer 413. For example, the first protection pattern MS1 may include a material of an emission layer forming the intermediate layer 413. As another example, the first protection pattern MS1 may include a host material of the emission layer.

The second protection pattern MS2 may be formed on the intermediate layer 413 and may correspond to the side of the area of the second electrode 412 facing toward the through area TA. In some exemplary embodiments, the second protection pattern MS2 may be formed between the second electrode 412 and the second encapsulation unit EU2. For example, the second protection pattern MS2 may be formed between the second electrode 412 and a first encapsulation layer 471 of the second encapsulation unit EU2, and, as such, a side of the second electrode 412 may be spaced apart from the second encapsulation unit EU2, thereby effectively protecting the side of the second electrode 412. The second protection pattern MS2 may include any suitable material. In some exemplary embodiments, the second protection pattern MS2 may include a material that does not mix with the material forming the second electrode 412, for example, an organic material. In some exemplary embodiments, the second protection pattern MS2 may include a part of a material forming the intermediate layer 413. For example, the second protection pattern MS2 may include the material of the emission layer forming the intermediate layer 413. As another example, the second protection pattern MS2 may include the host material of the emission layer.

Descriptions of other elements of the display apparatus 400 are the same as described in association with the display apparatus 300, and, as such, detailed descriptions are omitted. According to one or more exemplary embodiments, in the display apparatus 400, the first protection pattern MS1 and the second protection pattern MS2 may be formed on the intermediate layer 413 and may correspond to the side of the area of the second electrode 412 facing toward the through area TA. That is, in an operation before the display apparatus 400 is finally manufactured, permeation of moisture through the side of the second electrode 412 may be effectively blocked or reduced via the first protection pattern MS1 and the second protection pattern MS2.

The first protection pattern MS1 and the second protection pattern MS2 are spaced apart from each other in FIG. 8. However, when the first display area DA1 and the second display area DA2 are connected to each other as shown in FIG. 2C, the first protection pattern MS1 and the second protection pattern MS2 may be connected to each other, and, in some exemplary embodiments, may surround the through area TA.

Figure 9:
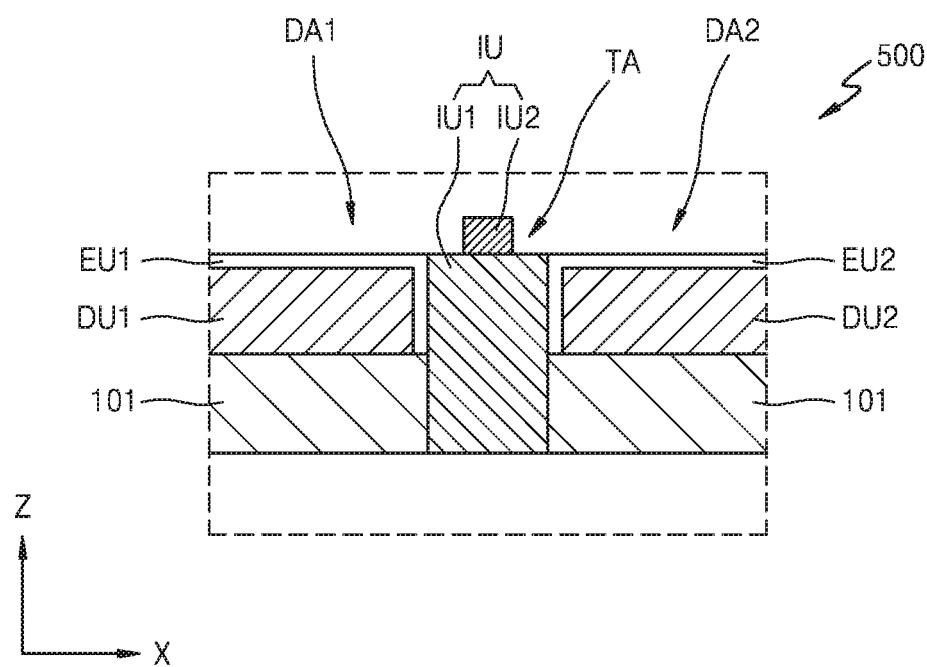
FIG. 9 is a schematic cross-sectional view of a display apparatus, according to one or more exemplary embodiments.

FIG. 9 is a schematic cross-sectional view of a display apparatus, according to one or more exemplary embodiments.

Referring to FIG. 9, the display apparatus 500 may include the first display area DA1, the second display area DA2, and the through area TA. The through area TA may be disposed between the first display area DA1 and the second display area DA2. In some exemplary embodiments, the display apparatus 500 may include the substrate 101. That is, the display apparatus 500 of FIG. 9 is the same as the display apparatus 100 of FIG. 1, except for an insertion unit IU. As such, detailed descriptions of elements other than the insertion unit IU are omitted to avoid obscuring exemplary embodiments described herein. Although not shown, the display apparatus 500 of FIG. 9 may apply to the display apparatuses 200, 300, and 400 described above. Not only the display apparatus 500 of FIG. 9, but also the display apparatuses 200, 300, and 400 may apply to display apparatuses 600 and 700 of FIGS. 10 through 12 that will be described in more detail below.

The display apparatus 500 may include the insertion unit IU. The insertion unit IU may include an insertion member IU1 and a connection member IU2. The insertion member IU1 may be disposed in correspondence with the through area TA. Although the insertion member IU1 tightly contacts the substrate 101 and the encapsulation units EU1 and EU2 in FIG. 9, exemplary embodiments are not limited thereto. For instance, and the insertion member IU1 may be spaced apart from the substrate 101 and the encapsulation units EU1 and EU2.

The insertion member IU1 may perform at least one of various functions and may transfer driving force or electric force to the connection member IU2 that will be described in more detail below. The insertion member IU1 may support the connection member IU2. In some exemplary embodiments, the insertion member IU1 may be disposed in the through are TA and may perform a simple non-display area function.

The connection member IU2 may be a driving member or a display member that generates light, and may perform other various functions. The connection member IU2 may overlap the through area TA or may be disposed outside the through area TA. In some exemplary embodiments, the connection member IU2 may be spaced apart from the first display area DA1 and the second display area DA2.

Figure 10:
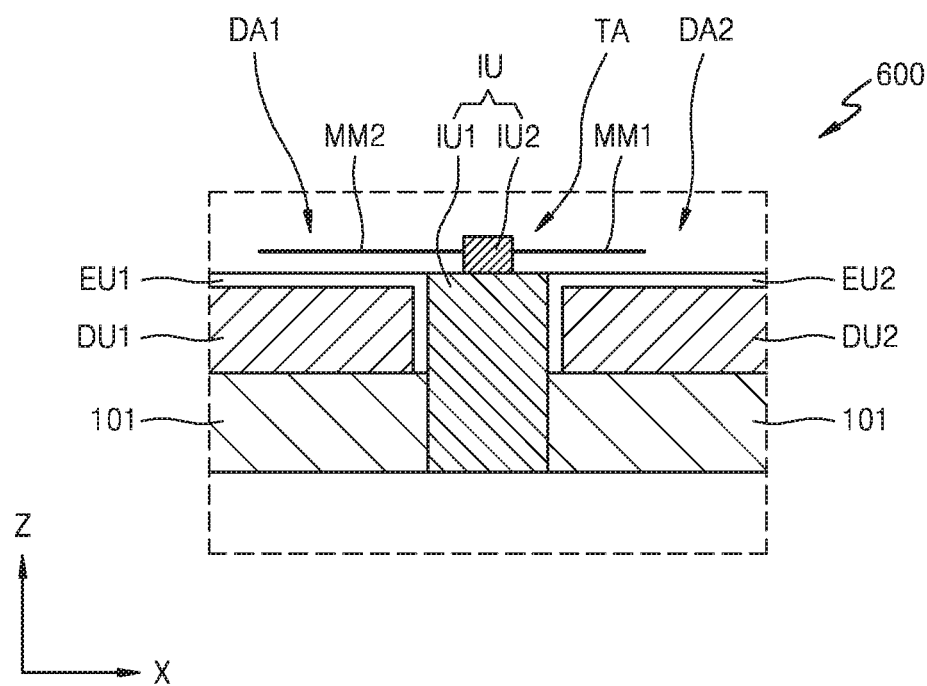
FIG. 10 is a schematic cross-sectional view of a display apparatus, according to one or more exemplary embodiments.

FIG. 10 is a schematic cross-sectional view of a display apparatus, according to one or more exemplary embodiments.

Referring to FIG. 10, the display apparatus 600 may include a first motion member MM1 and a second motion member MM2 in addition to the other elements of the display apparatus 500 of FIG. 9. For descriptive convenience, the differences between FIGS. 9 and 10 will now be described below.

The first motion member MM1 and the second motion member MM2 may be connected to the connection member IU2. The first motion member MM1 and the second motion member MM2 may be moved by the connection member IU2. The first motion member MM1 and the second motion member MM2 may independently move, and, in some exemplary embodiments, may integrally move. In some exemplary embodiments, the first motion member MM1 and the second motion member MM2 may be moved by the insertion member IU1. In some exemplary embodiments, the first motion member MM1 and the second motion member MM2 may be one of a second hand, a minute hand, and an hour hand of a clock. In this manner, information regarding a time display may be displayed on the first display area DA1 and the second display area DA2. The first motion member MM1 and the second motion member MM2 may be spaced apart from the first display area DA1 and the second display area DA2.

Figure 11:
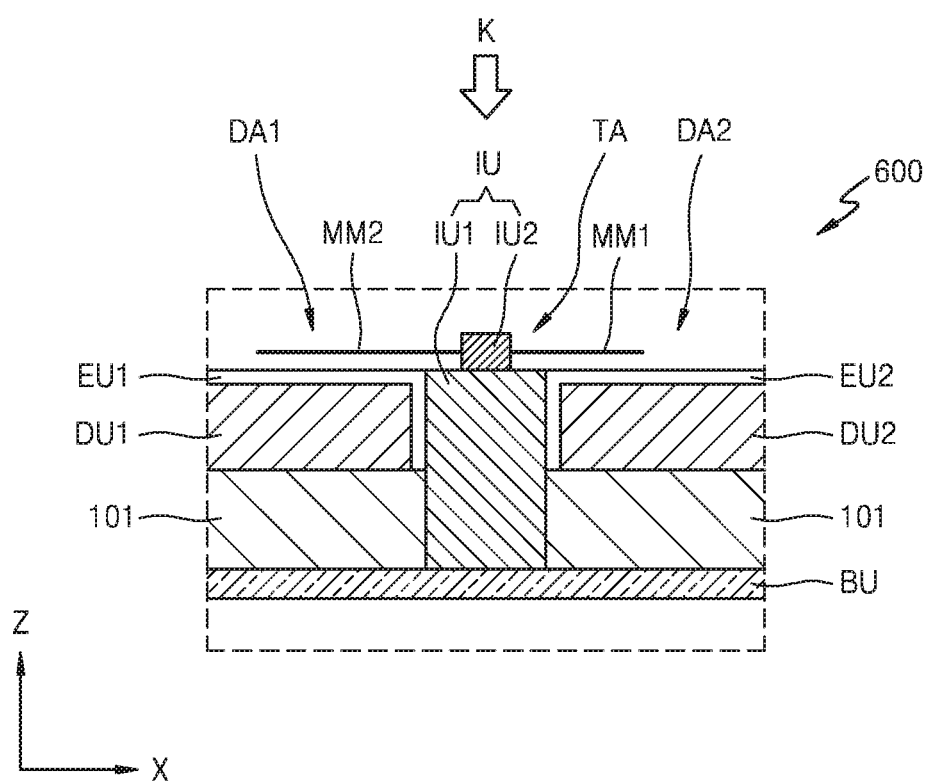
FIG. 11 is a schematic cross-sectional view of a display apparatus, according to one or more exemplary embodiments.
Figure 12:
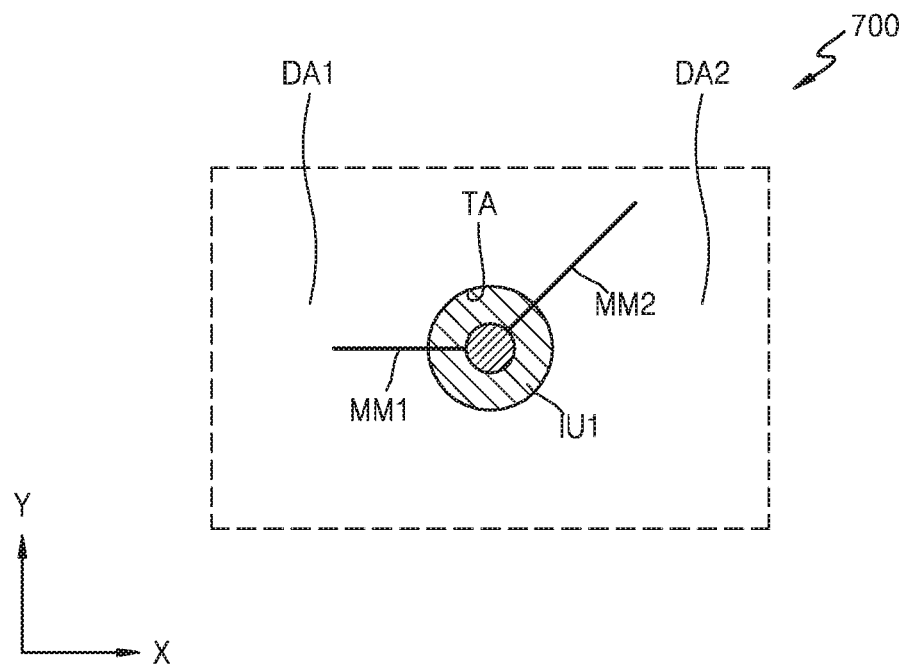
FIG. 12 is a partial plan view of the display apparatus of FIG. 11 as viewed in a direction K, according to one or more exemplary embodiments.

FIG. 11 is a schematic cross-sectional view of a display apparatus, according to one or more exemplary embodiments. FIG. 12 is a partial plan view of the display apparatus of FIG. 11 as viewed in a direction K, according to one or more exemplary embodiments.

Referring to FIGS. 11 and 12, the display apparatus 700 may further include a base member BU in addition to the components described in association with the display apparatus 600 of FIG. 10. For descriptive convenience, the differences between FIGS. 10 and 11 will be described below.

The base member BU may be disposed in a lower portion of the insertion member IU1. That is, the base member BU may be disposed in a lower portion of the substrate 101. The base member BU may support the insertion member IU1. The base member BU may be disposed in the lower portion of the substrate 101 to support the substrate 101, thereby improving the durability of the display apparatus 700. In some exemplary embodiments, the base member BU may send a different function (or signal), for example, an electrical signal or power, to the insertion member IU1.

The first motion member MM1 and the second motion member MM2 may be connected to and may be moved by the connection member IU2. The first motion member MM1 and the second motion member MM2 may independently move, and, in some exemplary embodiments, may integrally move. In some exemplary embodiments, the first motion member MM1 and the second motion member MM2 may be moved by the insertion member IU1 or the base member BU. In some exemplary embodiments, the first motion member MM1 and the second motion member MM2 may be one of a second hand, a minute hand, and an hour hand of a clock. In this manner, information regarding a time display may be displayed on the first display area DA1 and the second display area DA2.

FIGS. 13A through 13F are cross-sectional views of a display apparatus at various stages of manufacture, according to one or more exemplary embodiments. To this end, a method of manufacturing the display apparatus 300 of FIG. 5 will be described in association with FIGS. 13A through 13F. The method of manufacturing the display apparatus 300 is described as an example. Further, descriptions of the materials used to form various components, members, etc., have been omitted to avoid obscuring exemplary embodiments described herein. Also, the description in association with FIGS. 13 through 13F may apply to the display apparatuses 100, 200, 500, 600, and 700.

Figure 13A:
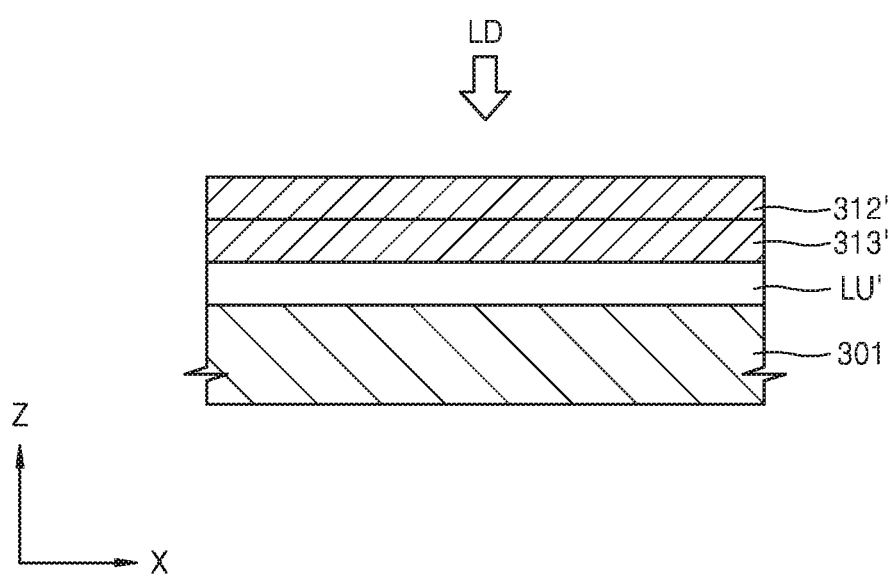
FIGS. 13A, 13B, 13C, 13D, 13E, and 13F are cross-sectional views of a display apparatus at various stages of manufacture, according to one or more exemplary embodiments.

Referring to FIG. 13A, a preliminary lower structure LU' for forming a lower structure that will be described below, a preliminary intermediate layer 313' for forming an intermediate layer that will be described below, and a preliminary second electrode 312' for forming a second electrode that will be described below may be formed on the substrate 301.

Figure 13B:
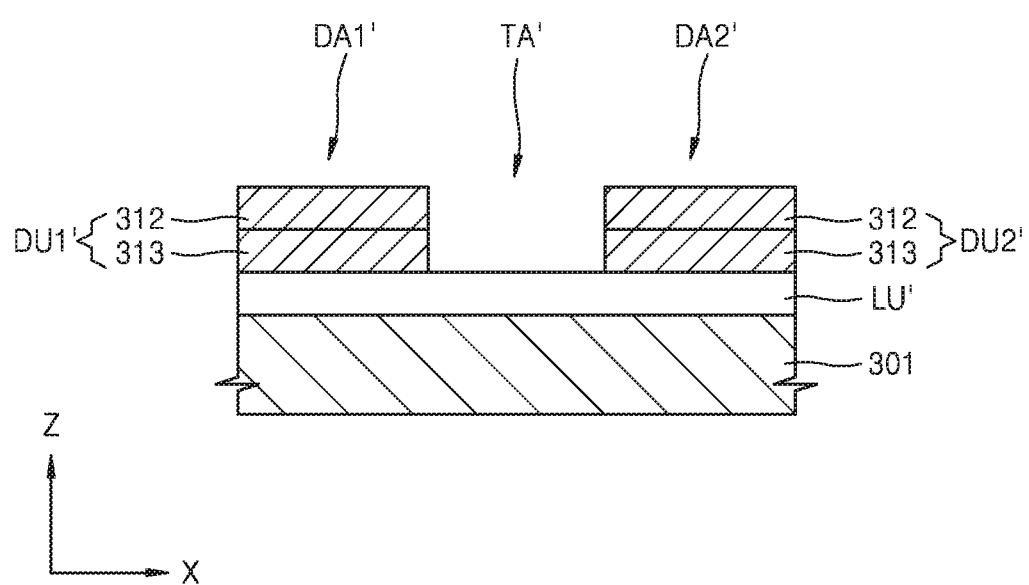

A preliminary through area TA' may be formed as shown in FIG. 13B by performing one or more etching processes using an etching source LD, such that the preliminary through area TA' may correspond to an area that will overlap with a through area that will be described below. The etching source LD may have various types, and, include, for example, a laser beam. Referring to FIG. 13B, since the preliminary through area TA' is formed, a preliminary first display area DA1' and a preliminary second display area DA2' may be formed having the preliminary through area TA' disposed between the preliminary first display area DA1' and the preliminary second display area DA2'. The preliminary through area TA' may not be formed in a thickness direction of at least the substrate 301 or the preliminary lower structure LU'. That is, the preliminary through area TA may not extend into the preliminary lower structure LU' and the substrate 301. In some exemplary embodiments, the preliminary through area TA' may be formed in a thickness direction of the substrate 301 and the preliminary lower structure LU'. Each of the preliminary first display area DA1' and the preliminary second display area DA2' may include the intermediate layer 313 and the second electrode 312.

Figure 13C:
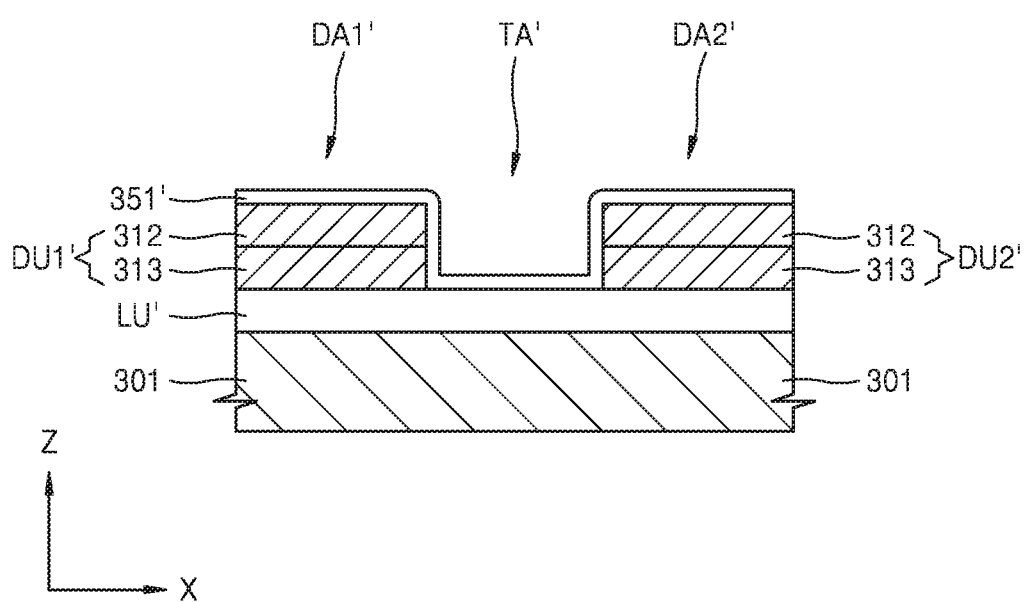

Referring to FIG. 13C, a preliminary first encapsulation layer 351' for forming a first encapsulation layer may be formed. The preliminary first encapsulation layer 351' may be formed on the preliminary first display area DA1', the preliminary second display area DA2', and the preliminary through area TA'.

Figure 13D:
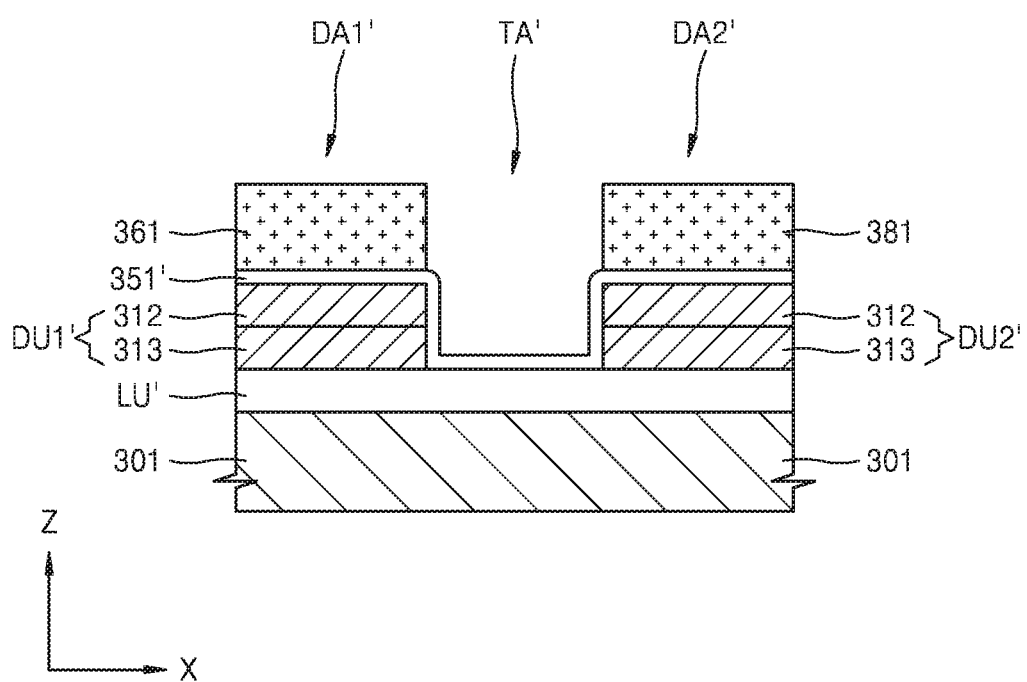

Referring to FIG. 13D, the intermediate encapsulation layer 361 and the intermediate encapsulation layer 381 may be formed on the preliminary first encapsulation layer 351', such that the intermediate encapsulation layer 361 and the intermediate encapsulation layer 381 may respectively correspond to the preliminary first display area DA1' and the preliminary second display area DA2'. The intermediate encapsulation layer 361 and the intermediate encapsulation layer 381 may have a pattern and may be patterned by using various methods. For example, the intermediate encapsulation layer 361 and the intermediate encapsulation layer 381 may be formed via a printing technology.

Figure 13E:
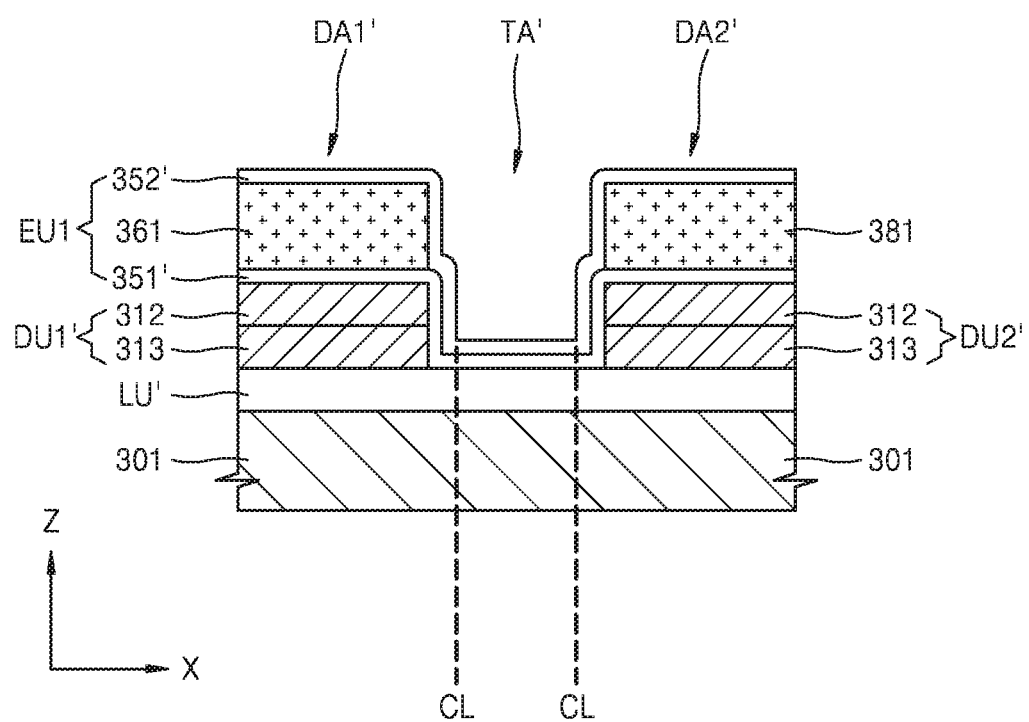

Referring to FIG. 13E, a preliminary second encapsulation layer 352' for forming a second encapsulation layer may be formed. The preliminary second encapsulation layer 352' may be formed to correspond to the preliminary first display area DA1', the preliminary second display area DA2', and the preliminary through area TA', and, in some exemplary embodiments, may cover the intermediate encapsulation layer 361 and the intermediate layer 381. The preliminary second encapsulation layer 352' may contact the preliminary first encapsulation layer 351' in an area corresponding to the preliminary through area TA'.

According to one or more exemplary embodiments, a cutting line CL may be disposed in the preliminary through area TA' and a cutting operation may be performed in relation to the cutting line CL. In this manner, the substrate 301, the preliminary lower structure LU', the preliminary first encapsulation layer 351', and the preliminary second encapsulation layer 352' that correspond to the preliminary through area TA' may be removed in association with the cutting operation. The cutting operation may be performed by using various methods, for example, using a laser beam.

Figure 13F:
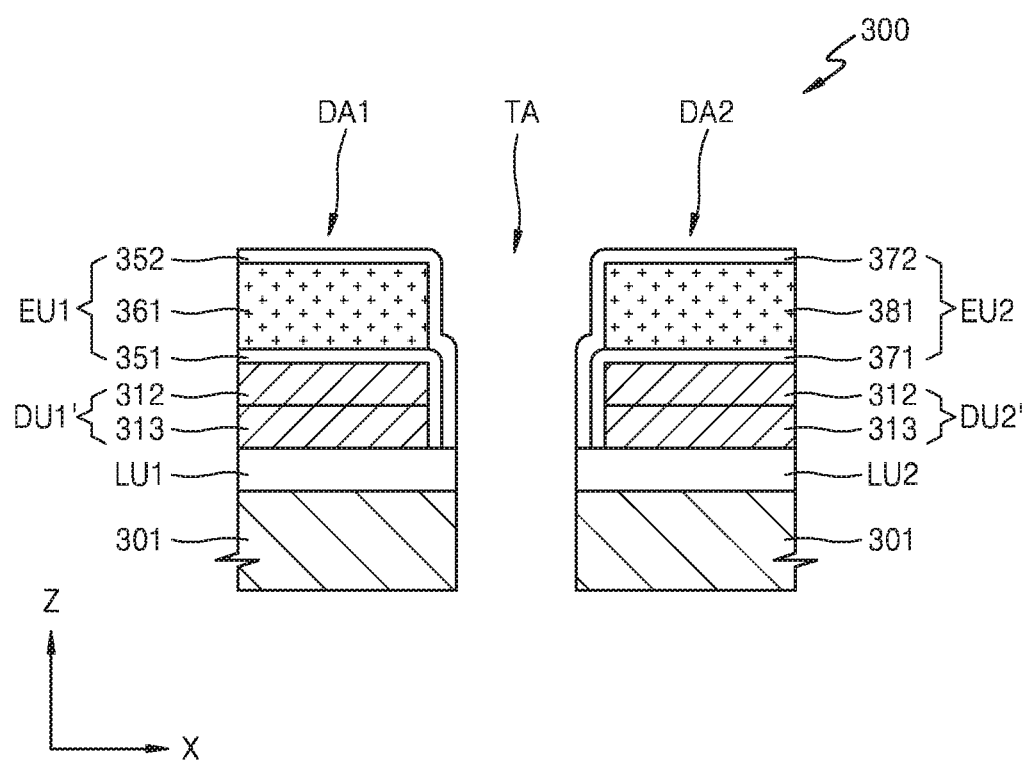

Accordingly, the display apparatus 300 may be manufactured as shown in FIG. 13F. In this manner, the manufacturing method may easily form the display apparatus 300 including the first display area DA1 and the second display area DA2 with the through area TA disposed between the first display area DA1 and the second display area DA2. That is, the through area TA may be easily formed and the formation process may reduce damage to the first display unit DU1 and the second display unit DU2. Although not shown, a protection film may be further formed on the lower portion of the substrate 301, and the through area TA may be removed in the cutting operation. Such a protection film may apply to exemplary embodiments that will be described below in association with FIGS. 14A through 14H.

FIGS. 14A through 14H are cross-sectional views of a display apparatus at various stages of manufacture, according to one or more exemplary embodiments. To this end, a method of manufacturing the display apparatus 400 of FIG. 8 will be described in association with FIGS. 14A through 14H. The method of manufacturing the display apparatus 400 is described as an example. Further, descriptions of materials used to form members, components, etc., have been omitted to avoid obscuring exemplary embodiments described herein. Also, the description in association with FIGS. 14A through 14H may apply to the formation of display apparatuses 100, 200, 500, 600, and 700.

Figure 14A:
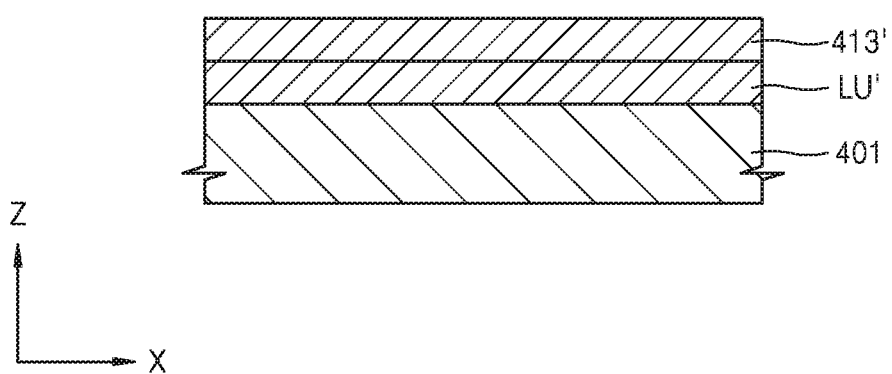
FIGS. 14A, 14B, 14C, 14D, 14E, 14F, 14G, and 14H are cross-sectional views of a display apparatus at various stages of manufacture, according to one or more exemplary embodiments.

Referring to FIG. 14A, the preliminary lower structure LU' for forming a lower structure that will be described below, and a preliminary intermediate layer 413' for forming an intermediate layer that will be described below may be formed on the substrate 301.

Figure 14B:
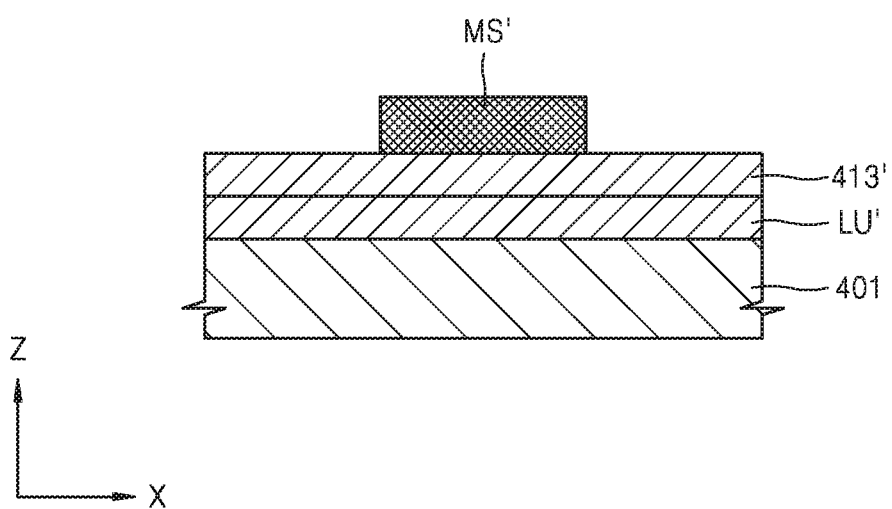

Referring to FIG. 14B, a preliminary protection pattern MS' for forming a protection pattern may be formed on the preliminary intermediate layer 413'. The preliminary protection pattern MS' may be formed to correspond to an area that will overlap a through area that will be described below.

Figure 14C:
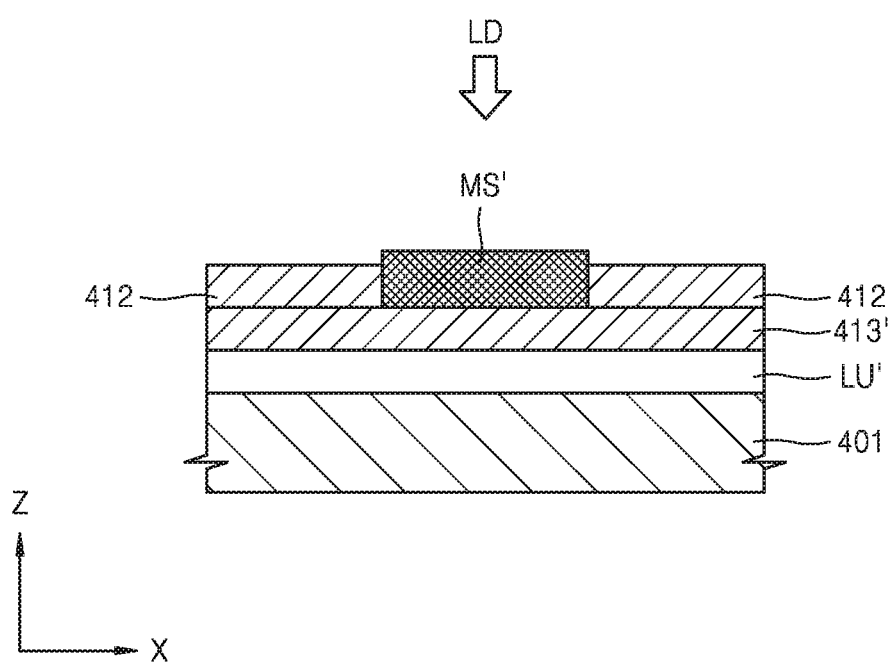

Referring to FIG. 14C, a second electrode 412 may be formed on the preliminary intermediate layer 413'. The second electrode 412 may be formed adjacent to the preliminary protection pattern MS', and, in some exemplary embodiments, may be formed adjacent to a side of the preliminary protection pattern MS'. In this manner, in some exemplary embodiments, when the preliminary protection pattern MS' includes a material that does not mix with the second electrode 412, the second electrode 412 may be patterned by the preliminary protection pattern MS' without a separate patterning operation. That is, the second electrode 412 may not mix with the preliminary protection pattern MS', may be formed in the side of the preliminary protection pattern MS', and, in some exemplary embodiments, may be spaced apart from at least one area of a top surface of the preliminary protection pattern MS'.

Figure 14D:
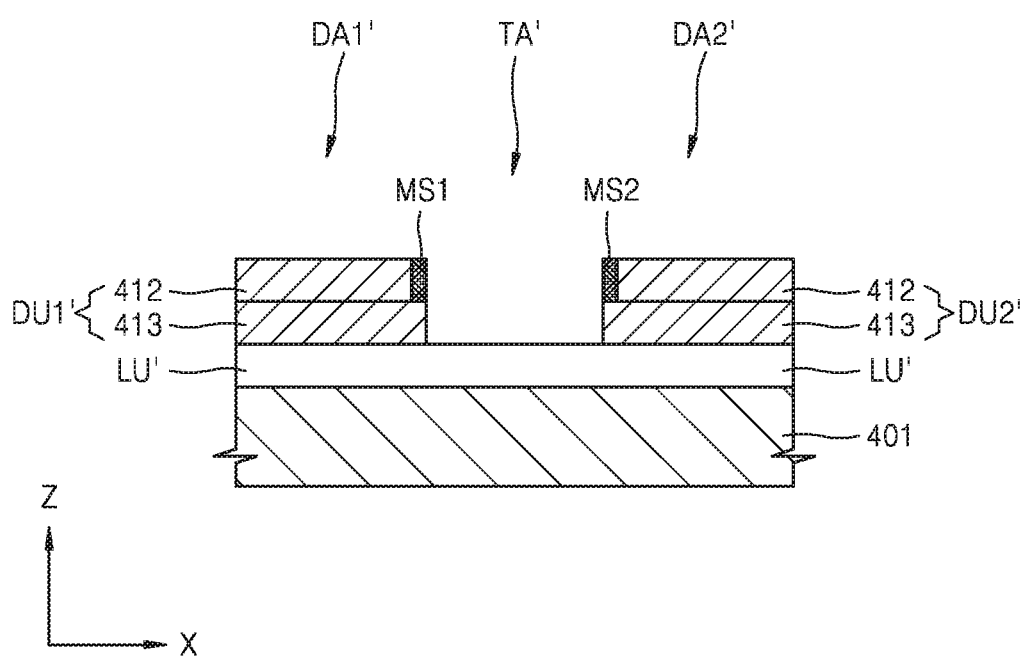

The preliminary through area TA' may be formed as shown in FIG. 14D by performing an etching process using the etching source LD, such that the preliminary through area TA' may correspond to the area that will overlap with the through area that will be described below. The etching source LD may have various types, and, include, for example, a laser beam. Referring to FIG. 14D, since the preliminary through area TA' is formed, the preliminary first display area DA1' and the preliminary second display area DA2' may be formed having the preliminary through area TA' disposed between the preliminary first display area DA1' and the preliminary second display area DA2'. The preliminary through area TA' may not be formed in a thickness direction of at least a substrate 401 or the preliminary lower structure LU'. In some exemplary embodiments, the preliminary through area TA' may be formed in a thickness direction of the substrate 401 and the preliminary lower structure LU'.

According to one or more exemplary embodiments, each of the preliminary first display area DA1' and the preliminary second display area DA2' may include the intermediate layer 413 and the second electrode 412. When the preliminary through area TA' is formed, one area of the preliminary protection pattern MS' may be removed so that the first protection pattern MS1 and the second protection pattern MS2 may be formed. In some exemplary embodiments, when the preliminary through area TA' is formed, the preliminary protection pattern MS' may be wholly removed, and, as such, the first protection pattern MS1 and the second protection pattern MS2 may not be formed.

Figure 14E:
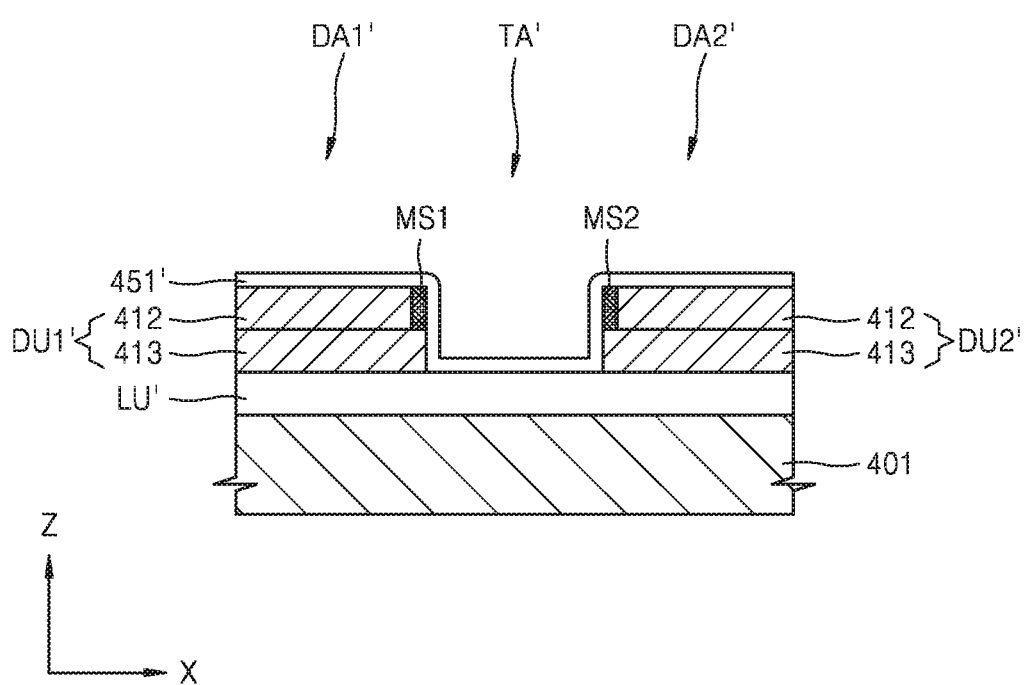

Referring to FIG. 14E, a preliminary first encapsulation layer 451' for forming a first encapsulation layer may be formed. The preliminary first encapsulation layer 451' may be formed on the preliminary first display area DA1', the preliminary second display area DA2', and the preliminary through area TA'.

Figure 14F:
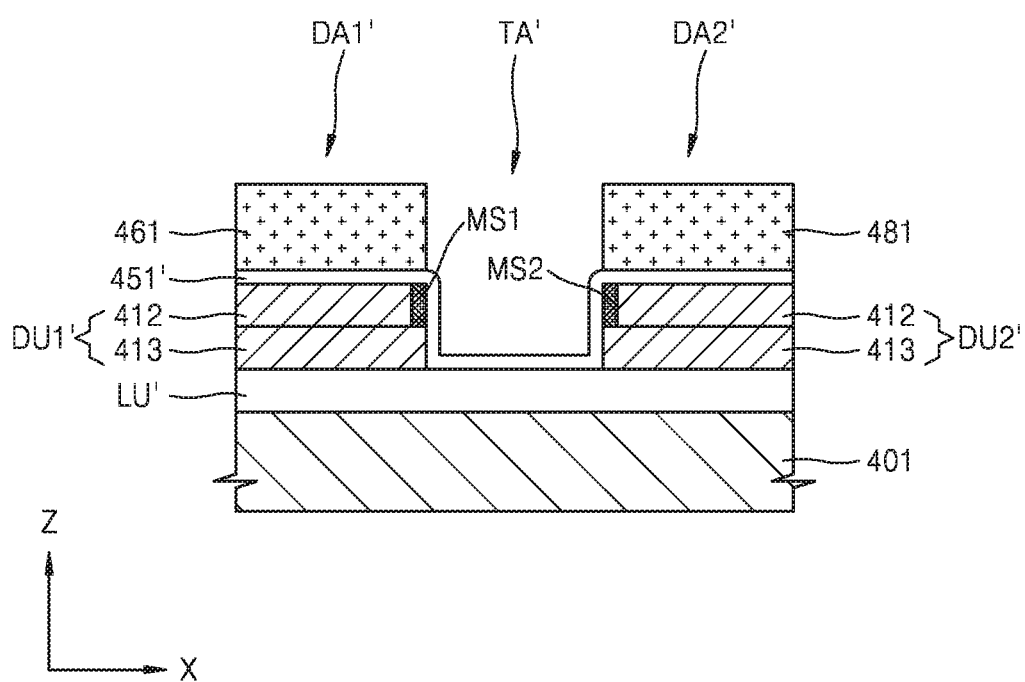

Referring to FIG. 14F, an intermediate encapsulation layer 461 and an intermediate encapsulation layer 481 may be formed on the preliminary first encapsulation layer 451', such that the intermediate encapsulation layer 461 and the intermediate encapsulation layer 481 may respectively correspond to the preliminary first display area DA1' and the preliminary second display area DA2'. The intermediate encapsulation layer 461 and the intermediate encapsulation layer 481 may have a pattern and may be patterned by using various methods. For example, the intermediate encapsulation layer 461 and the intermediate encapsulation layer 481 may be formed via a printing technology.

Figure 14G:
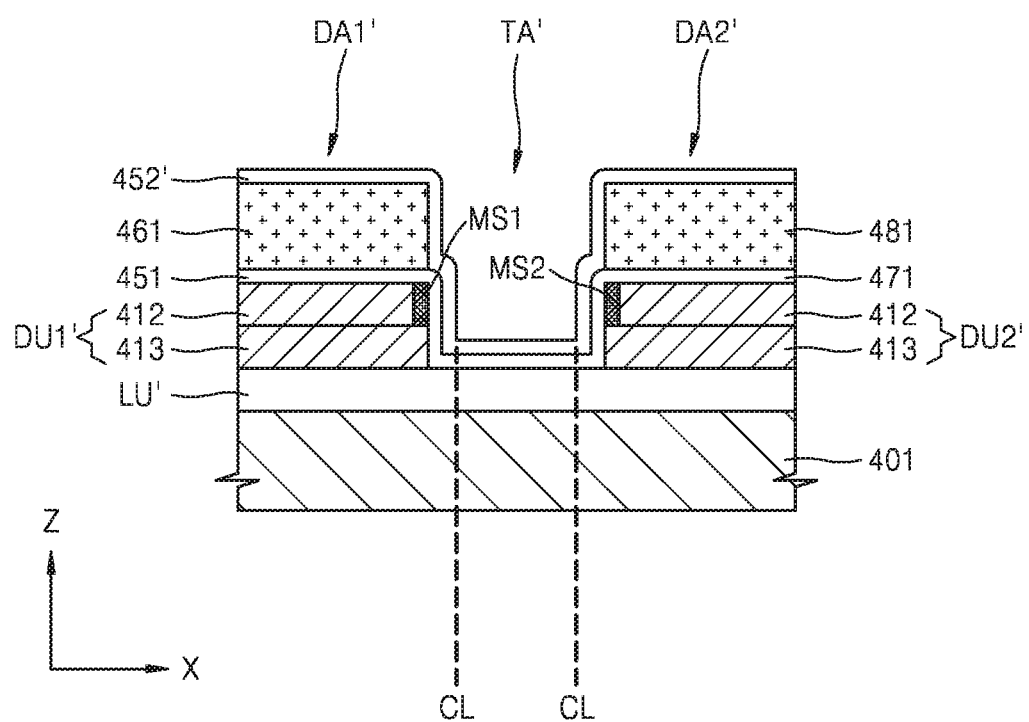

Referring to FIG. 14G, a preliminary second encapsulation layer 452' for forming a second encapsulation layer may be formed. The preliminary second encapsulation layer 452' may be formed to correspond to the preliminary first display area DA1', the preliminary second display area DA2', and the preliminary through area TA', and, in some exemplary embodiments, may cover the intermediate encapsulation layer 461 and the intermediate encapsulation layer 481. The preliminary second encapsulation layer 452' may contact the preliminary first encapsulation layer 451' in an area corresponding to the preliminary through area TA'.

A cutting line CL may be disposed in the preliminary through area TA' and a cutting operation may be performed in relation to the cutting line CL, and, as such, the substrate 401, the preliminary lower structure LU', the preliminary first encapsulation layer 451', and the preliminary second encapsulation layer 452' that correspond to the preliminary through area TA' may be removed. The cutting operation may be performed by using various methods, for example, a laser beam.

Figure 14H:
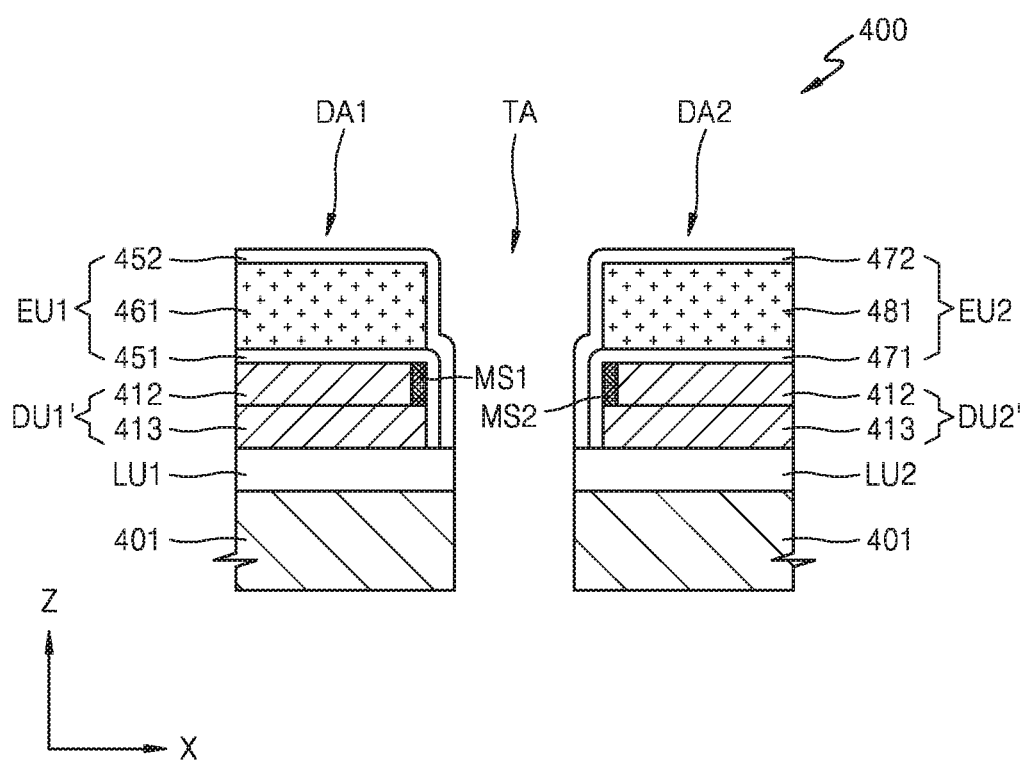

Accordingly, the display apparatus 400 may be manufactured as shown in FIG. 14H. In this manner, the manufacturing method may easily form the display apparatus 400 including the first display area DA1 and the second display area DA2 with the through area TA disposed between the first display area DA1 and the second display area DA2. That is, the through area TA may be easily formed and the formation process may reduce damage of the first display unit DU1 and the second display unit DU2. In this manner, after the preliminary protection pattern MS' is formed, the second electrode 412 may be formed, thereby facilitating patterning of the second electrode 412. The first protection pattern MS1 and the second protection pattern MS2 may effectively protect a side of an area of the second electrode 412 facing toward the through area TA.

According to one or more exemplary embodiments, a display apparatus having an improved durability and an improved characteristic of image quality, and a method of manufacturing the display apparatus have been described. In this manner, an insertion unit (such as a clock mechanism) may be formed in the through area to add a function to the display apparatus. It is contemplated, however, that the insertion unit may correspond to any suitable mechanism to add a function to the display apparatus.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A display apparatus comprising:
    a substrate;
    a first display area disposed on the substrate, the first display area comprising a first display unit configured to generate light and a first encapsulation unit disposed on the first display unit;
    a second display area disposed on the substrate, the second display area comprising a second display unit configured to generate light and a second encapsulation unit disposed on the second display unit; and
    a separation region comprising a space between the first display area and the second display area so as to distinguish the first display area from the second display area in at least one region,
    wherein:
        at least a portion of the first encapsulation unit covers at least one region of the separation region;
        at least a portion of the second encapsulation unit covers at least one region of the separation region; and
        the first encapsulation unit and the second encapsulation unit comprise a same material,
    wherein the first display area further comprises a first lower structure,
    wherein the first lower structure comprises:
        an insulating layer disposed on the substrate; and
        a thin film transistor disposed on the substrate, the thin film transistor being electrically connected to the first display unit and comprising an electrode; and wherein, in a direction normal to a surface of the substrate, the insulating layer is disposed between the electrode and the substrate.

2. The display apparatus of claim 1, wherein the separation region extends through at least a portion of a thickness of the substrate.

3. The display apparatus of claim 2, wherein at least one area of the first encapsulation unit and the second encapsulation unit is disposed on a top surface of the substrate.

4. The display apparatus of claim 2, wherein the first encapsulation unit or the second encapsulation unit is spaced apart from the separation region.

5. The display apparatus of claim 1, wherein at least a region of the first encapsulation unit is formed to cover a side of the at least one region or at least a region of the second encapsulation unit is formed to cover a side of the at least one region.

6. The display apparatus of claim 2, wherein the first display area and the second display area are connected to each other in an area outside the separation region.

7. The display apparatus of claim 1, wherein the separation region extends to at least one edge of the display apparatus.

8. The display apparatus of claim 1, wherein the separation region is one of a plurality of separation regions.

9. A display apparatus, comprising
a first display area comprising a first display unit configured to generate light and a first encapsulation unit disposed on the first display unit;
a second display area comprising a second display unit configured to generate light and a second encapsulation unit disposed on the second display unit; and
a separation region comprising a space between the first display area and the second display area so as to distinguish the first display area from the second display area in at least one region,
wherein:
at least a portion of the first encapsulation unit covers at least one region of the separation region;
at least a portion of the second encapsulation unit covers at least one region of the separation region;
the first encapsulation unit and the second encapsulation unit comprise a same material;
the separation region comprises a first separation region and a second separation region;
the display apparatus further comprises a third display unit configured to generate light and a third display area comprising a third encapsulation unit disposed on the third display unit;
the first display area and the second display area are formed comprising the first separation region disposed between the first display area and the second display area; and
the second display area and the third display area are formed comprising the second separation region disposed between the second display area and the third display area.

10. The display apparatus of claim 1, wherein the first encapsulation unit or the second encapsulation unit comprises a plurality of encapsulation layers.

11. The display apparatus of claim 1, wherein the first encapsulation unit comprises:
a first encapsulation layer disposed on the first display unit;
a third encapsulation layer disposed on the first encapsulation layer; and a first intermediate encapsulation layer disposed between the first encapsulation layer and the third encapsulation layer.

12. A display apparatus comprising:
a first display area comprising a first display unit configured to generate light and a first encapsulation unit disposed on the first display unit;
a second display area comprising a second display unit configured to generate light and a second encapsulation unit disposed on the second display unit; and
a separation region comprising a space between the first display area and the second display area so as to distinguish the first display area from the second display area in at least one region,
wherein:
at least a portion of the first encapsulation unit covers at least one region of the separation region;
at least a portion of the second encapsulation unit covers at least one region of the separation region;
the first encapsulation unit and the second encapsulation unit comprise a same material,
wherein the first encapsulation unit comprises:
a first encapsulation layer disposed on the first display unit;
a third encapsulation layer disposed on the first encapsulation layer; and
a first intermediate encapsulation layer disposed between the first encapsulation layer and the third encapsulation layer, and
wherein the first encapsulation layer and the third encapsulation layer contact one another in at least an area.

13. The display apparatus of claim 1, wherein the second encapsulation unit comprises:
a second encapsulation layer disposed on the second display unit;
a fourth encapsulation layer disposed on the second encapsulation layer; and
a second intermediate encapsulation layer disposed between the second encapsulation layer and the fourth encapsulation layer.

14. A display apparatus comprising:
a first display area comprising a first display unit configured to generate light and a first encapsulation unit disposed on the first display unit;
a second display area comprising a second display unit configured to generate light and a second encapsulation unit disposed on the second display unit; and
a separation region comprising a space between the first display area and the second display area so as to distinguish the first display area from the second display area in at least one region,
wherein:
at least a portion of the first encapsulation unit covers at least one region of the separation region;
at least a portion of the second encapsulation unit covers at least one region of the separation region;
the first encapsulation unit and the second encapsulation unit comprise a same material,
wherein the second encapsulation unit comprises:
a second encapsulation layer disposed on the second display unit;
a fourth encapsulation layer disposed on the second encapsulation layer; and
a second intermediate encapsulation layer disposed between the second encapsulation layer and the fourth encapsulation layer, and wherein the second encapsulation layer and the fourth encapsulation layer contact each other in at least an area.

15. The display apparatus of claim 1, wherein the first display unit or the second display unit comprises:
a first electrode;
a second electrode disposed on the first electrode; and
an intermediate layer disposed between the first electrode and the second electrode, the intermediate layer comprising an organic emission layer.

16. A display apparatus comprising:
a first display area comprising a first display unit configured to generate light and a first encapsulation unit disposed on the first display unit;
a second display area comprising a second display unit configured to generate light and a second encapsulation unit disposed on the second display unit; and
a separation region comprising a space between the first display area and the second display area so as to distinguish the first display area from the second display area in at least one region,
wherein:
at least a portion of the first encapsulation unit covers at least one region of the separation region;
at least a portion of the second encapsulation unit covers at least one region of the separation region;
the first encapsulation unit and the second encapsulation unit comprise a same material,
wherein the first display unit or the second display unit comprises:
a first electrode;
a second electrode disposed on the first electrode; and
an intermediate layer disposed between the first electrode and the second electrode, the intermediate layer comprising an organic emission layer, and
wherein the display apparatus further comprises a first protection pattern disposed at a side of the second electrode of the first display unit.

17. The display apparatus of claim 16, wherein the first protection pattern is disposed between the second electrode and the first encapsulation unit.

18. The display apparatus of claim 16, wherein the first protection pattern comprises a material that does not mix with the second electrode.

19. The display apparatus of claim 16, wherein the first protection pattern is disposed on the intermediate layer.

20. A display apparatus comprising:
a first display area comprising a first display unit configured to generate light and a first encapsulation unit disposed on the first display unit;
a second display area comprising a second display unit configured to generate light and a second encapsulation unit disposed on the second display unit; and
a separation region comprising a space between the first display area and the second display area so as to distinguish the first display area from the second display area in at least one region,
wherein:
at least a portion of the first encapsulation unit covers at least one region of the separation region;
at least a portion of the second encapsulation unit covers at least one region of the separation region;
the first encapsulation unit and the second encapsulation unit comprise a same material,
wherein the first display unit or the second display unit comprises:
a first electrode;
a second electrode disposed on the first electrode; and
an intermediate layer disposed between the first electrode and the second electrode, the intermediate layer comprising an organic emission layer, and
wherein the display apparatus further comprises a second protection pattern disposed at a side of the second electrode of the second display unit.

21. The display apparatus of claim 20, wherein the second protection pattern is disposed between the second electrode and the second encapsulation unit.

22. The display apparatus of claim 20, wherein the second protection pattern comprises a material that does not mix with the second electrode.

23. The display apparatus of claim 20, wherein the second protection pattern is disposed on the intermediate layer.

24. The display apparatus of claim 1, wherein the first lower structure comprises:
a plurality of insulating layers, the insulating layer being one of the plurality of insulating layers; and
a plurality of thin film transistors, the thin film transistor being one of the plurality of thin film transistors.

25. The display apparatus of claim 24, wherein:
the first display unit comprises:
a first electrode;
a second electrode; and
an intermediate layer disposed between the first electrode and the second electrode, the intermediate layer comprising an organic emission layer; and
the first electrode is electrically connected to the thin film transistor.

26. The display apparatus of claim 1, wherein:
the thin film transistor further comprises an active layer disposed on the substrate,
the electrode overlaps the active layer such that the active layer is disposed between the electrode and the substrate; and
in the direction normal to the surface of the substrate, the insulating layer is disposed between the electrode and the active layer.

27. The display apparatus of claim 24, wherein lateral sides of the plurality of insulating layers of the first lower structure face the separation region.

28. The display apparatus of claim 1, wherein:
the second display area further comprises a second lower structure; and
the second lower structure comprises:
one or more insulating layers; and
one or more thin film transistors.

29. The display apparatus of claim 28, wherein:
the second display unit comprises:
a first electrode;
a second electrode; and
an intermediate layer disposed between the first electrode and the second electrode, the intermediate layer comprising an organic emission layer; and
the first electrode is electrically connected to a thin film transistor of the one or more thin film transistors of the second lower structure.

30. The display apparatus of claim 28, wherein a portion of the one or more insulating layers of the second lower structure contacts an area of the second encapsulation unit.

31. The display apparatus of claim 28, wherein lateral sides of the one or more insulating layers of the second lower structure face the separation region.

32. The display apparatus of claim 1, further comprising:
an insertion member disposed in correspondence with the separation region.

33. The display apparatus of claim 32, further comprising:
a connection member connected to the insertion member, the connection member being disposed outside the separation region.

34. The display apparatus of claim 33, further comprising:
a motion member connected to the connection member.

35. The display apparatus of claim 32, further comprising:
a base member connected to the insertion member,
wherein the first display unit and the second display unit are disposed between the base member and the first encapsulation unit and the second encapsulation unit.

36. A method of manufacturing a display apparatus, the method comprising:
forming a first display area on a substrate, the first display area comprising a first display unit configured to generate light and a first encapsulation unit disposed on the first display unit;
forming a second display area on the substrate, the second display area comprising a second display unit configured to generate light and a second encapsulation unit disposed on the second display unit; and
forming a separation region comprising a space between the first display area and the second display area so as to distinguish the first display area from the second display area in at least one region,
wherein:
at least a portion of the first encapsulation unit covers at least one region of the separation region;
at least a portion of the second encapsulation unit covers at least one region of the separation region;
the first encapsulation unit and the second the second encapsulation unit comprise a same material; and
forming the separation region comprises forming a preliminary separation region partially extending through a thickness of the first display unit and the second display unit, and
wherein the method further comprises:
removing, after forming the preliminary separation region, at least one area of a thickness of the substrate disposed in association with the preliminary separation region.

37. The method of claim 36, wherein the preliminary separation region is formed after forming a material for forming the first display unit and a material for forming the second display unit.

38. The method of claim 36, wherein:
each of the first display unit and the second display unit are formed comprising:
a first electrode;
a second electrode disposed on the first electrode; and
an intermediate layer disposed between the first electrode and the second electrode, the intermediate layer comprising an organic emission layer; and
the preliminary separation region is formed after forming both a material for forming the intermediate layer of the first display unit and the second display unit and a material for forming the second electrode of the first display unit and the second display unit.

39. The method of claim 36, wherein the first encapsulation unit and the second encapsulation unit are formed after forming the preliminary separation region.

40. The method of claim 39, wherein each of the first encapsulation unit and the second encapsulation unit are formed comprising:
a first encapsulation layer disposed on the first display unit or the second display unit;
a second encapsulation layer disposed on the first encapsulation layer; and
an intermediate encapsulation layer disposed between the first encapsulation layer and the second encapsulation layer.

41. The method of claim 36, wherein:
each of the first display unit and the second display unit is formed comprising:
a first electrode;
a second electrode disposed on the first electrode; and
an intermediate layer disposed between the first electrode and the second electrode, the intermediate layer comprising an organic emission layer;
the display apparatus further comprises:
a first protection pattern formed at a side of the second electrode of the first display unit; and
a second protection pattern formed at a side of the second electrode of the second display unit; and
the preliminary separation region is formed after forming a preliminary protection pattern for forming the first protection pattern and the second protection pattern on a preliminary intermediate layer for forming the intermediate layer and forming the second electrode adjacent to the preliminary protection pattern.

42. The method of claim 41, wherein forming the second electrode comprises patterning the second electrode disposed adjacent to the preliminary protection pattern.

43. The method of claim 36, wherein:
the first display area is formed further comprising a first lower structure, the first lower structure being formed comprising:
one or more first insulating layers; and
one or more first thin film transistors; and
the second display area is formed further comprising a second lower structure, the second lower structure being formed comprising:
one or more second insulating layers; and
one or more second thin film transistors.

44. The display apparatus of claim 1, wherein the electrode is a drain electrode or a source electrode of the thin film transistor.

* * * * *